US012198590B2

(12) United States Patent
Liu et al.

(10) Patent No.: US 12,198,590 B2
(45) Date of Patent: Jan. 14, 2025

(54) DRIVING CIRCUIT HAVING POST-FRAME RESET MODULE AND DISPLAY DEVICE

(71) Applicants: Chengdu CEC Panda Display Technology Co., Ltd., Sichuan (CN); BOE Technology Group Co., Ltd., Beijing (CN)

(72) Inventors: Yong Liu, Beijing (CN); Guozhi Wang, Beijing (CN); Wu Wang, Beijing (CN); Xingkai Fu, Beijing (CN); Zhongxin Wu, Beijing (CN)

(73) Assignees: Chengdu BOE Display Sci-tech Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/924,656

(22) PCT Filed: Dec. 15, 2021

(86) PCT No.: PCT/CN2021/138272
§ 371 (c)(1),
(2) Date: Nov. 10, 2022

(87) PCT Pub. No.: WO2023/108471
PCT Pub. Date: Jun. 22, 2023

(65) Prior Publication Data
US 2024/0221567 A1    Jul. 4, 2024

(51) Int. Cl.
*G09G 3/20* (2006.01)
(52) U.S. Cl.
CPC ....... *G09G 3/20* (2013.01); *G09G 2310/0264* (2013.01); *G09G 2310/08* (2013.01)

(58) Field of Classification Search
CPC ............ G09G 3/20; G09G 2310/0264; G09G 2310/08; G09G 3/3688; G09G 3/2092; G09G 3/3677; G11C 19/28
See application file for complete search history.

(56) References Cited

U.S. PATENT DOCUMENTS

2014/0159997 A1    6/2014  Chen et al.
2016/0358666 A1*  12/2016  Pang .................... G09G 3/3688
(Continued)

FOREIGN PATENT DOCUMENTS

CN         103578433 A       2/2014
CN         106023943 A      10/2016
(Continued)

*Primary Examiner* — Richard J Hong
(74) *Attorney, Agent, or Firm* — IPro, PLLC

(57) ABSTRACT

A driving circuit and a display device are provided. The driving circuit includes a pull-up node, an input module, a pull-up module, a first output module and a second output module; the input module is electrically connected to an input terminal and a pull-up node, and is configured to control a potential of the pull-up node under the control of an input signal provided by the input terminal; the pull-up module controls the potential of the pull-up node; the first output module outputs a first gate driving signal through the first driving output terminal under the control of the potential of the pull-up node; the second output module outputs a second gate driving signal through the second driving output terminal under the control of the potential of the pull-up node. The present disclosure may output a plurality of stages of gate driving signals and reduce the number of transistors, which is facilitate to the narrow border.

19 Claims, 21 Drawing Sheets

(56) References Cited

U.S. PATENT DOCUMENTS

| | | | | |
|---|---|---|---|---|
| 2019/0108809 A1* | 4/2019 | Zheng | .................... | G09G 3/20 |
| 2019/0392916 A1* | 12/2019 | Gu | .......................... | G09G 3/20 |
| 2020/0020266 A1* | 1/2020 | Feng | .................... | G11C 19/28 |
| 2020/0135287 A1* | 4/2020 | Han | .................... | G09G 3/3677 |
| 2020/0243034 A1 | 7/2020 | Gu et al. | | |
| 2021/0241673 A1 | 8/2021 | Liu et al. | | |
| 2021/0335210 A1 | 10/2021 | Han et al. | | |
| 2021/0366350 A1* | 11/2021 | Xue | .................... | G09G 3/2092 |
| 2022/0335870 A1 | 10/2022 | Gu et al. | | |

FOREIGN PATENT DOCUMENTS

| | | | |
|---|---|---|---|
| CN | 106531053 | A | 3/2017 |
| CN | 107316603 | A | 11/2017 |
| CN | 107507599 | A | 12/2017 |
| CN | 108154836 | A | 6/2018 |
| CN | 108597430 | A | 9/2018 |
| CN | 108597437 | A | 9/2018 |
| CN | 108877627 | A | 11/2018 |
| CN | 109192154 | A | 1/2019 |
| CN | 110390903 | A | 10/2019 |
| CN | 108932933 | B | 1/2020 |
| CN | 111149150 | A | 5/2020 |
| CN | 113257186 | A | 8/2021 |
| WO | 2020191695 | A1 | 10/2020 |
| WO | 2021169562 | A1 | 9/2021 |

\* cited by examiner

DRIVING CIRCUIT HAVING POST-FRAME RESET MODULE AND DISPLAY DEVICE

CROSS-REFERENCE TO RELATED APPLICATION

This application is the U.S. national phase of PCT Application No. PCT/CN2021/138272 filed on Dec. 15, 2021, which is incorporated herein by reference in its entirety.

TECHNICAL FIELD

The present disclosure relates to the field of display technology, in particular to a driving circuit and a display device.

BACKGROUND

The driving module in the display device in a related art includes a plurality of stages of driving circuits, and each driving circuit has a driving output terminal for outputting a corresponding gate driving signal. The existing driving circuit cannot reduce the number of transistors on the premise of realizing the output of a plurality of stages of gate driving signals, which is not conducive to realizing a narrow frame.

SUMMARY

In one aspect, the present disclosure provides in some embodiments a driving circuit, including: a pull-up node, an input module, a pull-up module, a first output module and a second output module; the input module is electrically connected to the input terminal and the pull-up node, and is configured to control a potential of the pull-up node under the control of an input signal provided by the input terminal; the pull-up module is electrically connected to the pull-up node, is configured to control the potential of the pull-up node: the first output module is electrically connected to a first driving output terminal and the pull-up node respectively, and is configured to output a first gate driving signal through the first driving output terminal under the control of the potential of the pull-up node: the second output module is electrically connected to the second driving output terminal and the pull-up node, respectively, and is configured to output a second gate driving signal through the second driving output terminal under the control of the potential of the pull-up node.

Optionally, the driving circuit further includes a first pull-down node and a first pull-down module: the first pull-down module is respectively electrically connected to the first pull-down node, the pull-up node, the input terminal, the first pull-down control terminal and the first voltage terminal, is configured to control to connect the first pull-down node and the first voltage terminal under the control of the potential of the pull-up node, and control the potential of the first pull-down node under the control of the first pull-down control signal provided by the first pull-down node, control to connect the first pull-down node and the first voltage terminal under the control of the input signal provided by the input terminal.

Optionally, the first pull-down control terminal is a first pull-down control clock signal terminal: the first pull-down module is also electrically connected to the second pull-down control clock signal terminal, and is configured to control to connect the first pull-down node and the first voltage terminal under the control of the second pull-down control clock signal provided by the second pull-down control clock signal terminal.

Optionally, the driving circuit further includes a first output pull-down module and a second output pull-down module: the first output pull-down module is respectively electrically connected to the first pull-down node, the first driving output terminal and the first voltage terminal, and is configured to control to connect the first driving output terminal and the first voltage terminal under the control of the potential of the first pull-down node: the second output pull-down module is respectively electrically connected to the first pull-down node, the second driving output terminal and the first voltage terminal, and is configured to control to connect the second driving output terminal and the first voltage terminal under the control of the potential of the first pull-down node.

Optionally, the driving circuit further includes a first pull-down node; wherein the pull-up module is further electrically connected to the first pull-down node, the pull-up reset terminal and the first voltage terminal, respectively, is configured to control to connect the pull-up node and the first voltage terminal under the control of the potential of the first pull-down node, and control to connect the pull-up node and the first voltage terminal under the control of the pull-up reset signal provided by the pull-up reset terminal.

Optionally, the first output module is also electrically connected to the first output clock signal terminal, is configured to control to connect the first driving output terminal and the first output clock signal terminal under the control of the potential of the pull-up node: the second output module is also electrically connected to the second output clock signal terminal, is configured to control to connect the second driving output terminal and the second output clock signal terminal under the control of the potential of the pull-up node.

Optionally, the driving circuit further includes a first output reset module and a second output reset module: the first output reset module is respectively electrically connected to the first reset control clock signal terminal, the first driving output terminal and the first voltage terminal, and is configured to control to connect the first driving output terminal and the first voltage terminal under the control of the first reset control clock signal provided by the first reset control clock signal terminal; the second output reset module is respectively electrically connected with the second reset control clock signal terminal, the second driving output terminal and the first voltage terminal, and is configured to control to connect the second driving output terminal and the first voltage terminal under the control of the second reset control clock signal provided by the second reset control clock signal terminal.

Optionally, the driving circuit further includes a first pull-down node and a post-frame reset module: the post-frame reset module is respectively electrically connected to a post-frame reset control terminal, the pull-up node, the first driving output terminal, the second driving output terminal, the first pull-down node and the first voltage terminal, is configured to control, under the control of a post-frame reset control signal provided by the post-frame reset control terminal, to connect the pull-up node and the first voltage terminal, to connect the first driving output terminal and the first voltage terminal, to connect the second driving output terminal and the first voltage terminal, and to connect the first pull-down node and the first voltage terminal.

Optionally, the driving circuit further includes a pre-frame reset module; the pre-frame reset module is respectively electrically connected to a pre-frame reset control terminal, the pull-up node and the first voltage terminal, and is configured to connect the pull-up node and the first voltage terminal under the control of the pre-frame reset control signal provided by the pre-frame reset control terminal.

Optionally, the first output module comprises a first output transistor and a first capacitor, and the second output module comprises a second output transistor and a second capacitor: a control electrode of the first output transistor is electrically connected to the pull-up node, a first electrode of the first output transistor is electrically connected to the first output clock signal terminal, and a second electrode of the first output transistor is electrically connected to the first driving output terminal: a first end of the first capacitor is electrically connected to the pull-up node, and a second end of the first capacitor is electrically connected to the first driving output terminal: a control electrode of the second output transistor is electrically connected to the pull-up node, a first electrode of the second output transistor is electrically connected to the second output clock signal terminal, and a second electrode of the second output transistor is electrically connected to the second driving output terminal: a first end of the second capacitor is electrically connected to the pull-up node, and a second end of the second capacitor is electrically connected to the second driving output terminal.

Optionally, the pull-up module comprises a first pull-up transistor and a second pull-up transistor: a control electrode of the first pull-up transistor is electrically connected to the first pull-down node, a first electrode of the first pull-up transistor is electrically connected to the pull-up node, and a second electrode of the first pull-up transistor is electrically connected to the first voltage terminal: a control electrode of the second pull-up transistor is electrically connected to the pull-up reset terminal, a first electrode of the second pull-up transistor is electrically connected to the pull-up node, and a second electrode of the second pull-up transistor is electrically connected to the first voltage terminal: the input module includes an input transistor: a control electrode of the input transistor is electrically connected to the input terminal, a first electrode of the input transistor is electrically connected to the input terminal or the second voltage terminal, and a second electrode of the input transistor is electrically connected to the pull-up node.

Optionally, the first pull-down module comprises a first pull-down transistor, a second pull-down transistor and a third pull-down transistor: a control electrode of the first pull-down transistor is electrically connected to the first pull-down control terminal, a first electrode of the first pull-down transistor is electrically connected to the first pull-down control terminal or the second voltage terminal, a second electrode of the first pull-down transistor is electrically connected to the first pull-down node: a control electrode of the second pull-down transistor is electrically connected to the pull-up node, a first electrode of the second pull-down transistor is electrically connected to the first pull-down node, and a second electrode of the second pull-down transistor is electrically connected to the first voltage terminal: a control electrode of the third pull-down transistor is electrically connected to the input terminal, a first electrode of the third pull-down transistor is electrically connected to the first pull-down node, and a second electrode of the third pull-down transistor is electrically connected to the first voltage terminal.

Optionally, the first pull-down control terminal is a first pull-down control clock signal terminal: the first pull-down module further comprises a fourth pull-down transistor: a control electrode of the fourth pull-down transistor is electrically connected to the second pull-down control clock signal terminal, a first electrode of the fourth pull-down transistor is electrically connected to the first pull-down node, and a second electrode of the fourth pull-down transistor is electrically connected to the first voltage terminal.

Optionally, the first output pull-down module includes a first output pull-down transistor, and the second output pull-down module includes a second output pull-down transistor: a control electrode of the first output pull-down transistor is electrically connected to the first pull-down node, a first electrode of the first output pull-down transistor is electrically connected to the first driving output terminal, and a second electrode of the first output pull-down transistor is electrically connected to the first voltage terminal: a control electrode of the second output pull-down transistor is electrically connected to the first pull-down node, a first electrode of the second output pull-down transistor is electrically connected to the second driving output terminal, and a second electrode of the second output pull-down transistor is electrically connected to the first voltage terminal.

Optionally, the first output reset module comprises a first output reset transistor, and the second output reset module comprises a second output reset transistor: a control electrode of the first output reset transistor is electrically connected to the first reset control clock signal terminal, a first electrode of the first output reset transistor is electrically connected to the first driving output terminal, and a second electrode of the first output reset transistor is electrically connected to the first voltage terminal: a control electrode of the second output reset transistor is electrically connected to the second reset control clock signal terminal, a first electrode of the second output reset transistor is electrically connected to the second driving output terminal, and a second electrode of the second output reset transistor is electrically connected to the first voltage terminal.

Optionally, the post-frame reset module comprises a first reset transistor, a second reset transistor, a third reset transistor, and a fourth reset transistor; a control electrode of the first reset transistor is electrically connected to the post-frame reset control terminal, a first electrode of the first reset transistor is electrically connected to the pull-up node, and a second electrode of the first reset transistor is electrically connected to the first voltage terminal: a control electrode of the second reset transistor is electrically connected to the post-frame reset control terminal, a first electrode of the second reset transistor is electrically connected to the first driving output terminal, and a second electrode of the second reset transistor is electrically connected to the first voltage terminal: a control electrode of the third reset transistor is electrically connected to the post-frame reset control terminal, a first electrode of the third reset transistor is electrically connected to the second driving output terminal, and a second electrode of the third reset transistor is electrically connected to the first voltage terminal: a control electrode of the fourth reset transistor is electrically connected to the post-frame reset control terminal, a first electrode of the fourth reset transistor is electrically connected to the first pull-down node, and a second electrode of the fourth reset transistor is electrically connected to the first voltage terminal.

Optionally, the pre-frame reset module comprises a pre-frame reset transistor: a control electrode of the pre-frame reset transistor is electrically connected to the pre-frame reset control terminal, a first electrode of the pre-frame reset transistor is electrically connected to the pull-up node, and a second electrode of the pre-frame reset transistor is electrically connected to the first voltage terminal.

Optionally, the driving circuit further includes a third output module; the third output module is electrically connected to the pull-up node, the third driving output terminal and the third output clock signal terminal, and is configured to control to connect the third driving output terminal and the third output clock signal terminal under the control of the potential of the pull-up node.

Optionally, the driving circuit further includes a third output reset module: the third output reset module is respectively electrically connected to the third reset control clock signal terminal, the third driving output terminal and the first voltage terminal, and is configured to control to connect the third driving output terminal and the first voltage terminal under the control of the third reset control clock signal provided by the third reset control clock signal terminal.

Optionally, the driving circuit further includes a post-frame reset module: the post-frame reset module is respectively electrically connected to the post-frame reset control terminal, the third driving output terminal and the first voltage terminal, and is configured to control to connect the third driving output terminal and the first voltage terminal under the control of the post-frame reset control signal provided by the post-frame reset control terminal.

Optionally, the third output module comprises a third output transistor; a control electrode of the third output transistor is electrically connected to the pull-up node, a first electrode of the third output transistor is electrically connected to the third output clock signal terminal, and a second electrode of the third output transistor is electrically connected to the third driving output terminal.

Optionally, the third output reset module comprises a third output reset transistor: a control electrode of the third output reset transistor is electrically connected to the third reset control clock signal terminal, a first electrode of the third output pull-down transistor is electrically connected to the third driving output terminal, and a second electrode of the third output pull-down transistor is electrically connected to the first voltage terminal.

Optionally, the post-frame reset module further comprises a fifth reset transistor: a control electrode of the fifth reset transistor is electrically connected to the post-frame reset control terminal, a first electrode of the fifth reset transistor is electrically connected to the third driving output terminal, and a second electrode of the fifth reset transistor is electrically connected to the first voltage terminal.

Optionally, the driving circuit further includes a second pull-down node and a second pull-down module: the first pull-down control terminal is a first control voltage terminal: the first control voltage terminal is configured to provide the first control voltage: the second pull-down module is respectively electrically connected to the second pull-down node, the pull-up node, the input terminal, the second control voltage terminal and the first voltage terminal, and is configured to control to connect the second pull-down node and the first voltage terminal under the control of the potential of the pull-up node, control the potential of the second pull-down node under the control of the second control voltage provided by the second control voltage terminal, and control to connect the second pull-down node and the first voltage terminal under the control of the input signal provided by the input terminal.

Optionally, the second pull-down module comprises a fifth pull-down transistor, a sixth pull-down transistor, and a seventh pull-down transistor: a control electrode of the fifth pull-down transistor is electrically connected to the second control voltage terminal, a first electrode of the fifth pull-down transistor is electrically connected to the second control voltage terminal or the second voltage terminal, and a second electrode of the fifth pull-down transistor is electrically connected to the second pull-down node: a control electrode of the sixth pull-down transistor is electrically connected to the pull-up node, a first electrode of the sixth pull-down transistor is electrically connected to the second pull-down node, and a second electrode of the sixth pull-down transistor is electrically connected to the first voltage terminal: a control electrode of the seventh pull-down transistor is electrically connected to the input terminal, a first electrode of the seventh pull-down transistor is electrically connected to the second pull-down node, and a second electrode of the seventh pull-down transistor is electrically connected to the first voltage terminal.

Optionally, the driving circuit further includes a second pull-down node; the first output pull-down module is also electrically connected to the second pull-down node, and is configured to control to connect the first driving output terminal and the first voltage terminal under the control of the potential of the second pull-down node: the second output pull-down module is also electrically connected to the second pull-down node, and is configured to control to connect the second driving output terminal and the first voltage terminal under the control of the potential of the second pull-down node.

Optionally, the driving circuit further includes a second pull-down node; the pull-up module is further electrically connected to the second pull-down node, and is configured to control to connect the pull-up node and the first voltage terminal under the control of the potential of the second pull-down node.

Optionally, the driving circuit further includes a second pull-down node; the post-frame reset module is also electrically connected to the second pull-down node, and is configured to control to connect the second pull-down node and the first voltage terminal under the control of the post-frame reset control signal.

Optionally, the first output pull-down module further includes a third output pull-down transistor, and the second output pull-down module further includes a fourth output pull-down transistor: a control electrode of the third output pull-down transistor is connected to the second pull-down node, a first electrode of the third output pull-down transistor is electrically connected to the first driving output terminal, and a second electrode of the third output pull-down transistor is electrically connected to the first voltage terminal: a control electrode of the fourth output pull-down transistor is electrically connected to the second pull-down node, a first electrode of the fourth output pull-down transistor is electrically connected to the second driving output terminal, and a second electrode of the fourth output pull-down transistor is electrically connected to the first voltage terminal.

Optionally, the pull-up module further comprises a third pull-up transistor: a control electrode of the third pull-up transistor is electrically connected to the second pull-down node, a first electrode of the third pull-up transistor is electrically connected to the pull-up node, and a second electrode of the third pull-up transistor is electrically connected to the first voltage terminal.

Optionally, the post-frame reset module further comprises a sixth reset transistor: a control electrode of the sixth reset transistor is electrically connected to the post-frame reset control terminal, a first electrode of the sixth reset transistor is electrically connected to the second pull-down node, and a second electrode of the sixth reset transistor is electrically connected to the first voltage terminal.

Optionally, the first pull-down module is further electrically connected to a second control voltage terminal, is configured to control to connect the first pull-down node and the first voltage terminal under the control of a second control voltage provided by the second control voltage terminal: the second pull-down module is also electrically connected to the first control voltage terminal, and is configured to control to connect the second pull-down node and the first voltage terminal under the control of the first control voltage provided by the first control voltage terminal.

Optionally, the first pull-down module further comprises an eighth pull-down transistor, and the second pull-down module further comprises a ninth pull-down transistor: a control electrode of the eighth pull-down transistor is electrically connected to the second control voltage terminal, a first electrode of the eighth pull-down transistor is electrically connected to the first pull-down node, and a second electrode of the eighth pull-down transistor is electrically connected to the first voltage terminal: a control electrode of the ninth pull-down transistor is electrically connected to the first control voltage terminal, a first electrode of the ninth pull-down transistor is electrically connected to the second pull-down node, and a second electrode of the ninth pull-down transistor is electrically connected to the first voltage terminal.

Optionally, the driving circuit further includes at least two output modules: the output module is electrically connected to the pull-up node and the corresponding driving output terminal respectively, and is configured to control to output the corresponding gate driving signal through the corresponding driving output terminal under the control of the potential of the pull-up node.

In a second aspect, a display device includes the driving circuit.

DETAILED DESCRIPTION

The technical solutions in the embodiments of the present disclosure will be clearly and completely described below with reference to the accompanying drawings in the embodiments of the present disclosure. Obviously, the described embodiments are only a part of the embodiments of the present disclosure, but not all of the embodiments. Based on the embodiments in the present disclosure, all other embodiments obtained by those of ordinary skill in the art without creative work shall fall within the protection scope of the present disclosure.

The transistors used in all the embodiments of the present disclosure may be triodes, thin film transistors, field effect transistors, or other devices with the same characteristics. In the embodiments of the present disclosure, in order to distinguish the two electrodes of the transistor except the control electrode, one electrode is called a first electrode, and the other electrode is called a second electrode.

In actual operation, when the transistor is a thin film transistor or a field effect transistor, the first electrode may be a drain electrode, and the second electrode may be a source electrode; or, the first electrode may be a source electrode, the second electrode may be a drain electrode.

Figure 1:
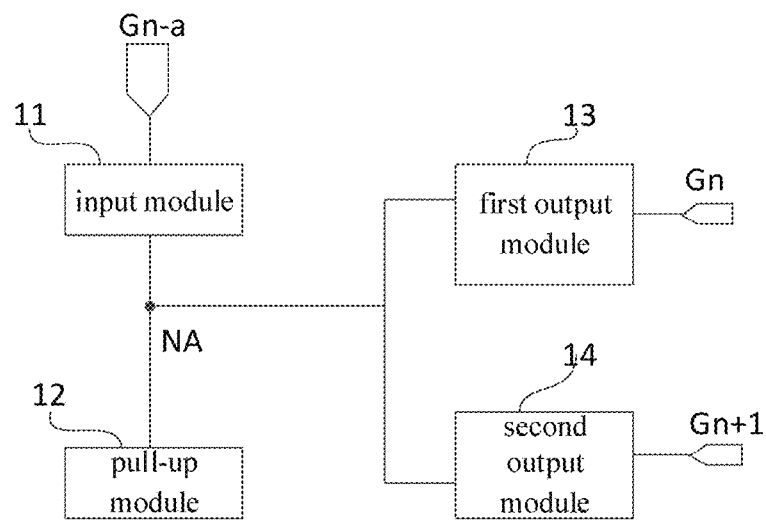
FIG. 1 is a structural diagram of a driving circuit according to an embodiment of the present disclosure.

As shown in FIG. 1, the driving circuit according to the embodiment of the present disclosure includes a pull-up node NA, an input module 11, a pull-up module 12, a first output module 13 and a second output module 14:

The input module 11 is electrically connected to the input terminal Gn-a and the pull-up node NA, and is configured to control a potential of the pull-up node NA under the control of an input signal provided by the input terminal Gn-a:

The pull-up module 12 is electrically connected to the pull-up node NA, is configured to control the potential of the pull-up node NA:

The first output module 13 is electrically connected to the first driving output terminal Gn and the pull-up node NA respectively, and is used to output a first gate driving signal through the first driving output terminal Gn under the control of the potential of the pull-up node NA:

The second output module 14 is electrically connected to the second driving output terminal Gn+1 and the pull-up node NA, respectively, and is configured to output a second gate driving signal through the second driving output terminal Gn+1 under the control of the potential of the pull-up node NA.

In the driving circuit described in the embodiment of the present disclosure, the first output module 13 and the second output module 14 share the pull-up node NA, and the first output module 13 and the second output module 14 output corresponding gate driving signals through the first driving output terminal Gn and the second driving output terminal Gn+1 respectively under the control of the potential of the pull node NA, so as to realize the output of two stages of gate driving signals and reduce the number of transistors (when one more pull-up node needs to be used, a transistor will need to be used to control the potential of the pull-up node), which greatly saves the layout space, reduces the loading of the driving circuit, and can achieve a display product design with a super narrow bezel.

Figure 2:
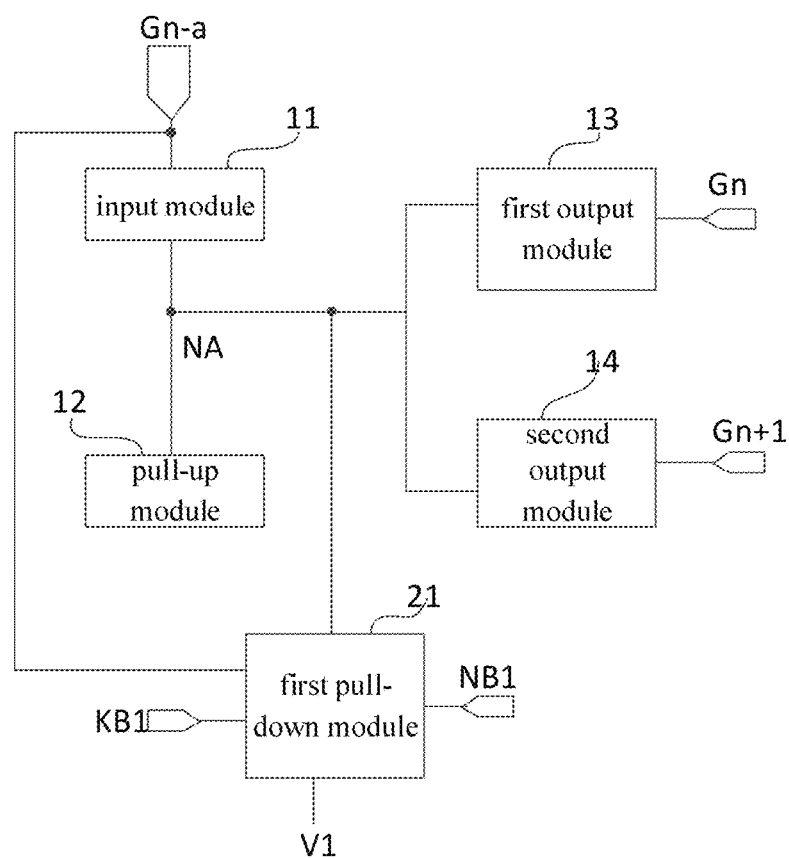
FIG. 2 is a structural diagram of a driving circuit according to at least one embodiment of the present disclosure.

As shown in FIG. 2, based on the embodiment of the driving circuit shown in FIG. 1, the driving circuit according to at least one embodiment of the present disclosure may further include a first pull-down node NB1 and a first pull-down module 21:

The first pull-down module 21 is respectively electrically connected to the first pull-down node NB1, the pull-up node NA, the input terminal Gn-a, the first pull-down control terminal KB1 and the first voltage terminal V1, is configured to control to connect the first pull-down node NB1 and the first voltage terminal V1 under the control of the potential of the pull-up node NA, and control the potential of the first pull-down node NB1 under the control of the first pull-down control signal provided by the first pull-down node NB1, control to connect the first pull-down node NB1 and the first voltage terminal V1 under the control of the input signal provided by the input terminal Gn-a.

The driving circuit according to at least one embodiment of the present disclosure may further include a first pull-down module 21, configured to control the potential of the first pull-down node NB1 under the control of the potential of the pull-up node NA, the first pull-down control signal, and the input signal.

In at least one embodiment of the present disclosure, the first voltage terminal V1 may be a low voltage terminal, but is not limited thereto.

Optionally, the first pull-down control terminal is a first pull-down control clock signal terminal: the first pull-down control clock signal terminal is used to provide a first pull-down control clock signal: Optionally, the signal provided by the pull-down control terminal is an AC signal:

The first pull-down module is also electrically connected to the second pull-down control clock signal terminal, and is configured to control to connect the first pull-down node and the first voltage terminal under the control of the second pull-down control clock signal provided by the second pull-down control clock signal terminal.

In specific implementation, when the driving circuit according to at least one embodiment of the present disclosure includes only one pull-down node, the first pull-down control terminal may be a first pull-down control clock signal terminal, and the first pull-down module that controls the potential of the first pull-down node can also control the potential of the first pull-down node under the control of the second pull-down control clock signal provided by the second pull-down control clock signal terminal.

Figure 3:
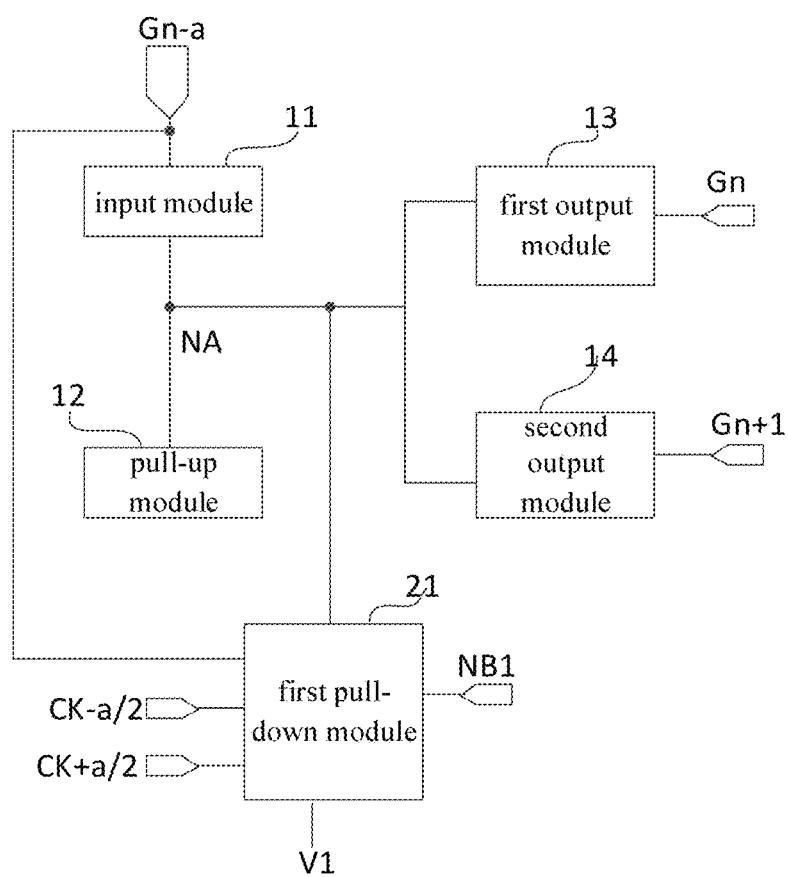
FIG. 3 is a structural diagram of a driving circuit according to at least one embodiment of the present disclosure.

As shown in FIG. 3, based on at least one embodiment of the driving circuit shown in FIG. 2, the first pull-down control terminal is a first pull-down control clock signal terminal CK−a/2; the first pull-down control clock signal terminal CK−a/2 is used to provide the first pull-down control clock signal:

The first pull-down module 21 is electrically connected to the first pull-down control clock signal terminal CK−a/2, and is configured to control the potential of the first pull-down node NB1 under the control of the first pull-down control clock signal:

The first pull-down module 21 is also electrically connected to the second pull-down control clock signal terminal CK+a/2, is configured to control to connect the first pull-down node NB1 and the first voltage terminal V1 under the control of the second pull-down control clock signal provided by the second pull-down control clock signal terminal CK+a/2.

The driving circuit according to at least one embodiment of the present disclosure further includes a first pull-down node: the pull-up module is further electrically connected to the first pull-down node, a pull-up reset terminal and a first voltage terminal, respectively, and is configured to control to connect the pull-up node and the first voltage terminal under the control of the potential of the first pull-down node, and control to connect the pull-up node and the first voltage terminal under the control of a pull-up reset signal provided by the pull-up reset terminal.

During specific implementation, the pull-up module may further control the potential of the pull-up node under the control of the potential of the first pull-down node and the pull-up reset signal provided by the pull-up reset terminal.

Figure 4:
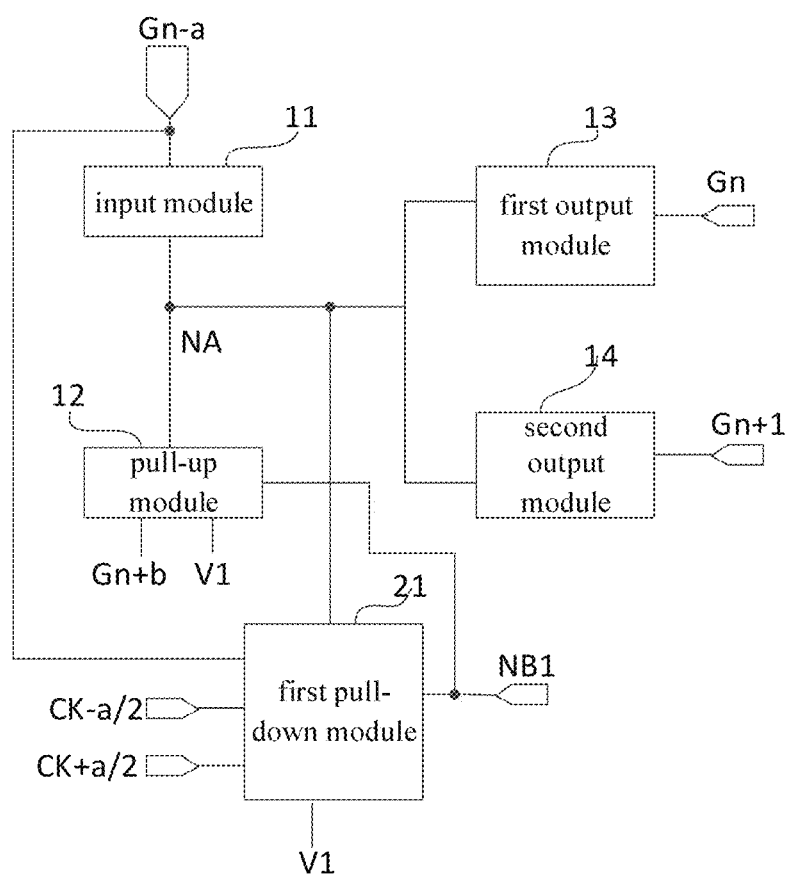
FIG. 4 is a structural diagram of a driving circuit according to at least one embodiment of the present disclosure.

As shown in FIG. 4, on the basis of at least one embodiment of the driving circuit shown in FIG. 3, the pull-up module 12 is further connected to the first pull-down node NB1, the pull-up reset terminal Gn+b and the first voltage terminal V1, is configured to control to connect the pull-up node NA and the first voltage terminal V1 under the control of the potential of the first pull-down node NB1, and control to connect the pull-up node NA and the first voltage terminal V1 under the control of the pull-up reset signal provided by the pull-up reset terminal Gn+b.

When at least one embodiment of the driving circuit shown in FIG. 4 of the present disclosure is in operation, the pull-up module 12 can reset the potential of the pull-up node NA under the control of the potential of the first pull-down node NB1 and the pull-up reset signal.

Optionally, the first output module is further electrically connected to the first output clock signal terminal, and is configured to control to connect the first driving output terminal and the first output clock signal terminal under the control of the potential of the pull-up node:

The second output module is also electrically connected to the second output clock signal terminal, is configured to control to connect the second driving output terminal and the second output clock signal terminal under the control of the potential of the pull-up node.

During specific implementation, the first output module and the second output module may control the first gate driving signal outputted by the first driving output terminal and the second gate driving signal outputted by the second driving output terminal according to the first output clock signal provided by the first output clock signal terminal and the second output clock signal provided by the second output clock signal terminal.

Figure 5:
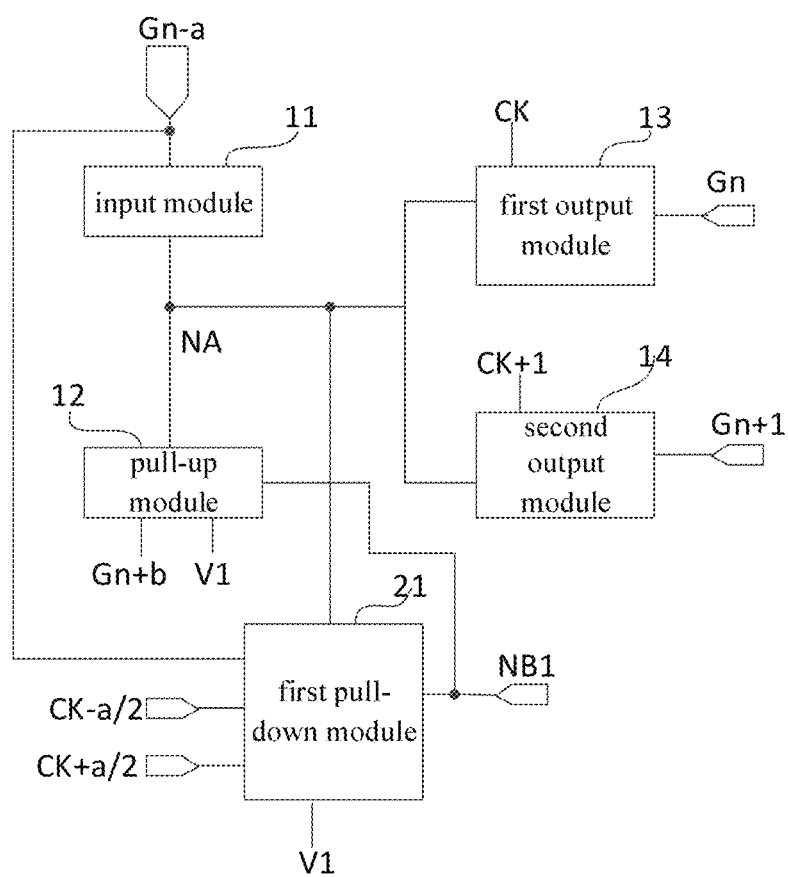
FIG. 5 is a structural diagram of a driving circuit according to at least one embodiment of the present disclosure.

As shown in FIG. 5, on the basis of at least one embodiment of the driving circuit shown in 4, The first output module 13 is also electrically connected to the first output clock signal terminal CK, is configured to control to connect the first driving output terminal Gn and the first output clock signal terminal CK under the control of the potential of the pull-up node NA:

The second output module 14 is also electrically connected to the second output clock signal terminal CK+1, is configured to control to connect the second driving output terminal Gn+1 and the second output clock signal terminal CK+1 under the control of the potential of the pull-up node NA.

In at least one embodiment of the present disclosure, the driving circuit may further include a first pull-down node and a post-frame reset module:

The post-frame reset module is respectively electrically connected to a post-frame reset control terminal, the pull-up node, the first driving output terminal, the second driving output terminal, the first pull-down node and the first voltage terminal, is configured to control to connect the pull-up node and the first voltage terminal under the control of a post-frame reset control signal provided by the post-frame reset control terminal, and to control to connect the first driving output terminal and the first voltage terminal, the second driving output terminal is controlled to be connected to the first voltage terminal, and control to connect the first pull-down node and the first voltage terminal. It should be noted that, the post-frame reset here refers to the reset after the display panel displays one frame or multiple frames of images.

During specific implementation, the driving circuit described in at least one embodiment of the present disclosure may further include a post-frame reset module, and after the end of a frame display time, the post-frame reset module resets the potential of the pull-up node, the first gate driving signal outputted by the first driving output terminal, the second gate driving signal outputted by the second driving output terminal, and the potential of the first pull-down node under the control of the post-frame reset control signal.

Figure 6:
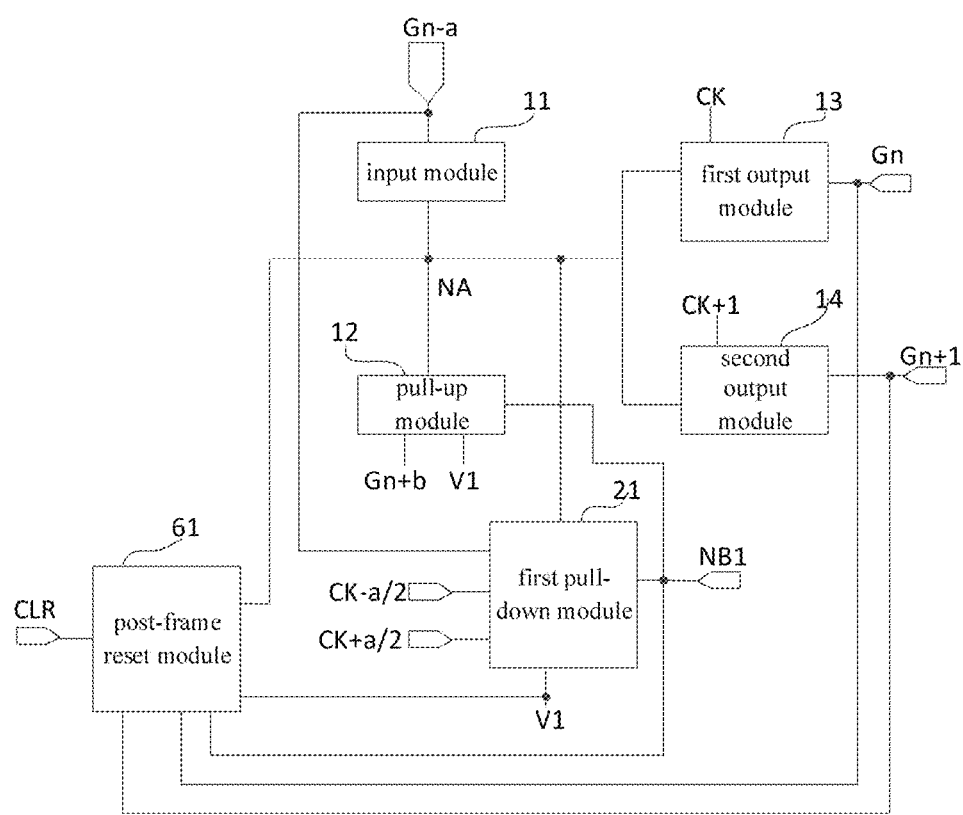
FIG. 6 is a structural diagram of a driving circuit according to at least one embodiment of the present disclosure.

As shown in FIG. 6, based on at least one embodiment of the driving circuit shown in FIG. 5, the driving circuit described in at least one embodiment of the present disclosure may further include a first pull-down node NB1 and a post-frame reset module 61:

The post-frame reset module 61 is respectively connected to the post-frame reset control terminal CLR, the pull-up node NA, the first driving output terminal Gn, the second driving output terminal Gn+1, and the first pull-down node NB1 and the first voltage terminal V1, and is configured to control to connect the pull-up node NA and the first voltage terminal V1 under the control of the post-frame reset control signal provided by the post-frame reset control terminal CLR, control to connect the first driving output terminal Gn and the first voltage terminal V1, control to connect the second driving output terminal Gn+1 and the first voltage terminal V1, and control to connect the first pull-down node NB1 and the first voltage terminal V1.

The driving circuit described in at least one embodiment of the present disclosure may further include a pre-frame reset module:

The pre-frame reset module is respectively electrically connected to a pre-frame reset control terminal, the pull-up node and the first voltage terminal, and is configured to connect the pull-up node and the first voltage terminal under the control of the pre-frame reset control signal provided by the pre-frame reset control terminal.

During specific implementation, the driving circuit described in at least one embodiment of the present disclosure may further include a pre-frame reset module, and before a frame display time, the pre-frame reset module resets the potential of the pull-up node under the control of the pre-frame reset control signal.

Figure 7:
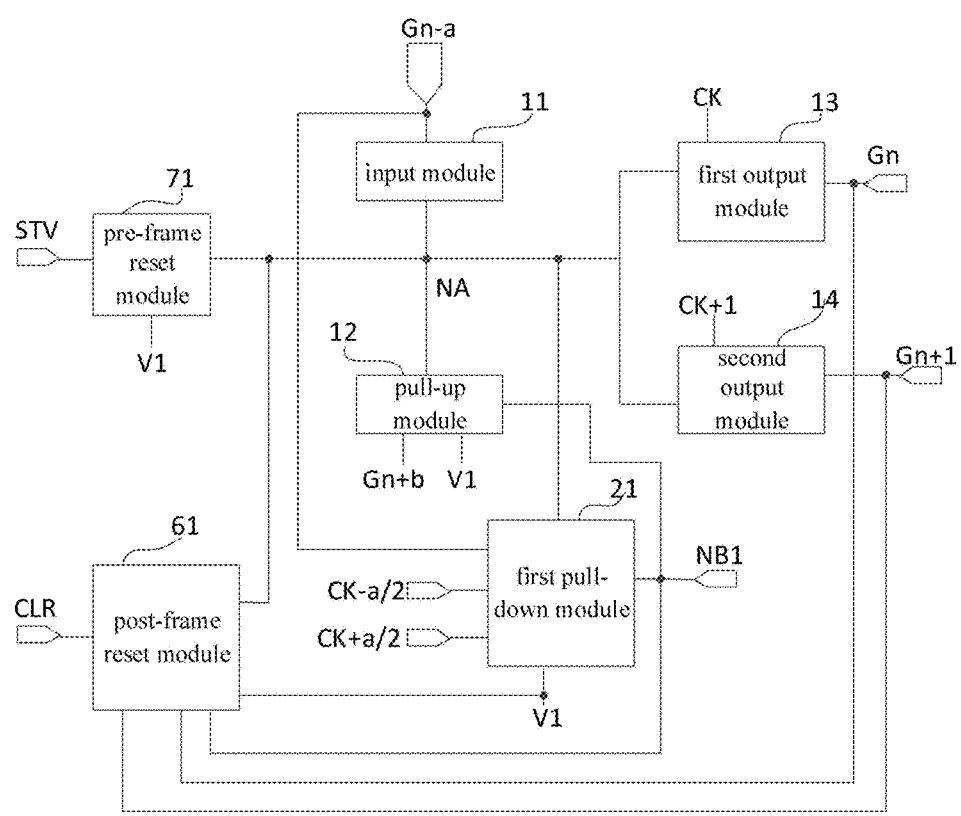
FIG. 7 is a structural diagram of a driving circuit according to at least one embodiment of the present disclosure.

As shown in FIG. 7, on the basis of at least one embodiment of the driving circuit shown in FIG. 6, the driving circuit described in at least one embodiment of the present disclosure may further include a pre-frame reset module 71:

The pre-frame reset module 71 is respectively electrically connected to the pre-frame reset control terminal STV, the pull-up node NA and the first voltage terminal V1, and is configured to control to connect the pull-up node NA and the first voltage terminal V1 under the control of the pre-frame reset control signal provided by the pre-frame reset control terminal STV.

In at least one embodiment of the present disclosure, the driving circuit may further include a first output pull-down module and a second output pull-down module:

The first output pull-down module is respectively electrically connected to the first pull-down node, the first driving output terminal and the first voltage terminal, and is configured to control to connect the first driving output terminal and the first voltage terminal under the control of the potential of the first pull-down node:

The second output pull-down module is respectively electrically connected to the first pull-down node, the second driving output terminal and the first voltage terminal, and is configured to control to connect the second driving output terminal and the first voltage terminal under the control of the potential of the first pull-down node.

During specific implementation, the driving circuit according to at least one embodiment of the present disclosure may further include a first output pull-down module and a second output pull-down module, and the first output pull-down module and the second output pull-down module share the first pull-down node: the first output pull-down module can control to pull down the potential of the first gate driving signal provided by the first driving output terminal under the control of the potential of the first pull-down node, and the second output pull-down module can control to pull down the potential of the second gate driving signal provided by the second driving output terminal under the control of the potential of the first pull-down node.

The driving circuit described in at least one embodiment of the present disclosure may further include a first output reset module and a second output reset module:

The first output reset module is respectively electrically connected to the first reset control clock signal terminal, the first driving output terminal and the first voltage terminal, and is configured to control to connect the first driving output terminal and the first voltage terminal under the control of the first reset control clock signal provided by the first reset control clock signal terminal:

The second output reset module is respectively electrically connected with the second reset control clock signal terminal, the second driving output terminal and the first voltage terminal, and is configured to control to connect the second driving output terminal and the first voltage terminal under the control of the second reset control clock signal provided by the second reset control clock signal terminal.

In at least one embodiment of the present disclosure, the driving circuit may further include a first output reset module and a second output reset module, and the first output reset module resets the first gate driving signal provided by the first driving output terminal under the control of the first reset control clock signal, and the second output reset module resets the second gate driving signal provided by the second driving output terminal under the control of the second reset control clock signal.

Figure 8:
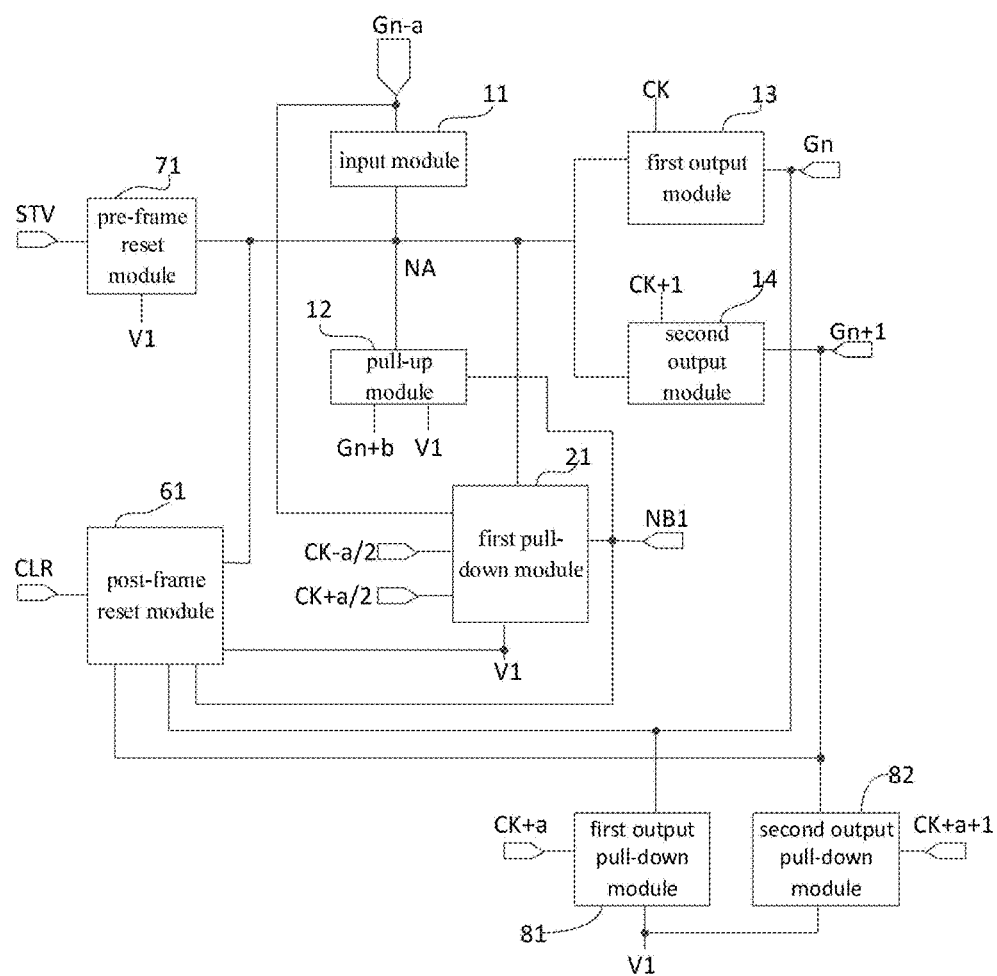
FIG. 8 is a structural diagram of a driving circuit according to at least one embodiment of the present disclosure.

As shown in FIG. 8, based on at least one embodiment of the driving circuit shown in FIG. 7, the driving circuit according to at least one embodiment of the present disclosure may further include a first output reset module 81 and a second output reset module 82:

The first output reset module 81 is electrically connected to the first reset control clock signal terminal CK+a, the first driving output terminal Gn and the first voltage terminal V1 respectively, and is configured to control to connect the first driving output terminal Gn and the first voltage terminal V1 under the control of the first reset control clock signal provided by the first reset control clock signal terminal CK+a:

The second output reset module 82 is electrically connected to the second reset control clock signal terminal CK+a+1, the second driving output terminal Gn+1 and the first voltage terminal V1 respectively, and is configured to control to connect the second driving output terminal Gn+1 and the first voltage terminal V1 under the control of the second reset control clock signal provided by the second reset control clock signal terminal CK+a+1.

Figure 9:
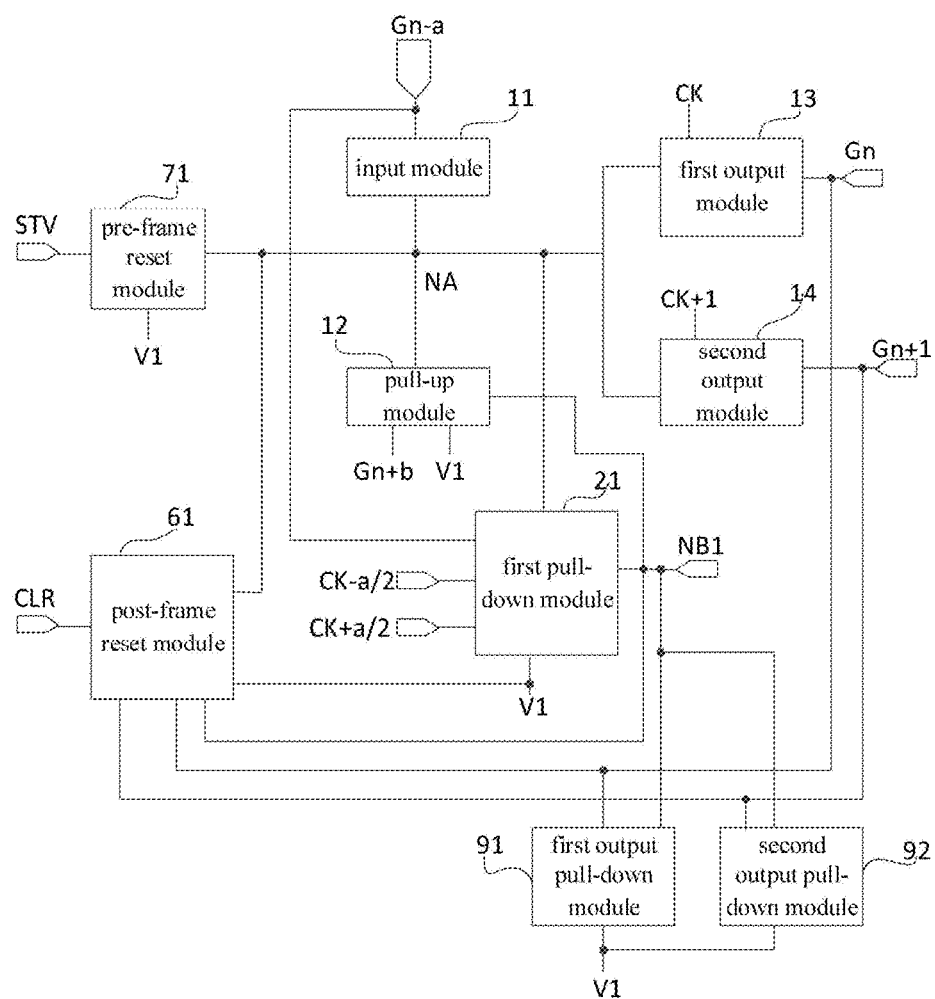
FIG. 9 is a structural diagram of a driving circuit according to at least one embodiment of the present disclosure.

As shown in FIG. 9, on the basis of at least one embodiment of the driving circuit shown in FIG. 7, the driving circuit described in at least one embodiment of the present disclosure may further include a first output pull-down module 91 and a second output pull-down module 92:

The first output pull-down module 91 is respectively electrically connected to the first pull-down node NB1, the first driving output terminal Gn and the first voltage terminal V1, and is configured to control to connect the first driving output terminal Gn and the first voltage terminal V1 under the control of the potential of the first pull-down node NB1:

The second output pull-down module 92 is electrically connected to the first pull-down node NB1, the second driving output terminal Gn+1 and the first voltage terminal V1 respectively, and is configured to control to connect the second driving output terminal Gn+1 and the first voltage terminal V1 under the control of the potential of the first pull-down node NB1.

Optionally, the first output module includes a first output transistor and a first capacitor, and the second output module includes a second output transistor and a second capacitor:

A control electrode of the first output transistor is electrically connected to the pull-up node, a first electrode of the first output transistor is electrically connected to the first output clock signal terminal, and a second electrode of the first output transistor is electrically connected to the first driving output terminal:

A first end of the first capacitor is electrically connected to the pull-up node, and a second end of the first capacitor is electrically connected to the first driving output terminal:

A control electrode of the second output transistor is electrically connected to the pull-up node, a first electrode of the second output transistor is electrically connected to the second output clock signal terminal, and a second electrode of the second output transistor is electrically connected to the second driving output terminal:

A first end of the second capacitor is electrically connected to the pull-up node, and a second end of the second capacitor is electrically connected to the second driving output terminal.

Optionally, the pull-up module includes a first pull-up transistor and a second pull-up transistor:

A control electrode of the first pull-up transistor is electrically connected to the first pull-down node, a first electrode of the first pull-up transistor is electrically connected to the pull-up node, and a second electrode of the first pull-up transistor is electrically connected to the first voltage terminal:

A control electrode of the second pull-up transistor is electrically connected to the pull-up reset terminal, a first electrode of the second pull-up transistor is electrically connected to the pull-up node, and a second electrode of the second pull-up transistor is electrically connected to the first voltage terminal; the input module includes an input transistor:

A control electrode of the input transistor is electrically connected to the input terminal, a first electrode of the input transistor is electrically connected to the input terminal or the second voltage terminal, and a second electrode of the input transistor is electrically connected to the pull-up node.

In at least one embodiment of the present disclosure, the second voltage terminal may be a high voltage terminal, but is not limited thereto.

Optionally, the first pull-down module includes a first pull-down transistor, a second pull-down transistor and a third pull-down transistor;

A control electrode of the first pull-down transistor is electrically connected to the first pull-down control terminal, a first electrode of the first pull-down transistor is electrically connected to the first pull-down control terminal or the second voltage terminal, a second electrode of the first pull-down transistor is electrically connected to the first pull-down node:

A control electrode of the second pull-down transistor is electrically connected to the pull-up node, a first electrode of the second pull-down transistor is electrically connected to the first pull-down node, and a second electrode of the second pull-down transistor is electrically connected to the first voltage terminal:

A control electrode of the third pull-down transistor is electrically connected to the input terminal, a first electrode of the third pull-down transistor is electrically connected to the first pull-down node, and a second electrode of the third pull-down transistor is electrically connected to the first voltage terminal.

Optionally, the first pull-down control terminal is a first pull-down control clock signal terminal: the first pull-down module further includes a fourth pull-down transistor;

A control electrode of the fourth pull-down transistor is electrically connected to the second pull-down control clock signal terminal, a first electrode of the fourth pull-down transistor is electrically connected to the first pull-down node, and a second electrode of the fourth pull-down transistor is electrically connected to the first voltage terminal.

Optionally, the first output pull-down module includes a first output pull-down transistor, and the second output pull-down module includes a second output pull-down transistor:

A control electrode of the first output pull-down transistor is electrically connected to the first pull-down node, a first electrode of the first output pull-down transistor is electrically connected to the first driving output terminal, and a second electrode of the first output pull-down transistor is electrically connected to the first voltage terminal:

A control electrode of the second output pull-down transistor is electrically connected to the first pull-down node, a first electrode of the second output pull-down transistor is electrically connected to the second driving output terminal, and a second electrode of the second output pull-down transistor is electrically connected to the first voltage terminal.

Optionally, the first output reset module includes a first output reset transistor, and the second output reset module includes a second output reset transistor:

A control electrode of the first output reset transistor is electrically connected to the first reset control clock signal terminal, a first electrode of the first output reset transistor is electrically connected to the first driving output terminal, and a second electrode of the first output reset transistor is electrically connected to the first voltage terminal:

A control electrode of the second output reset transistor is electrically connected to the second reset control clock signal terminal, a first electrode of the second output reset transistor is electrically connected to the second driving output terminal, and a second electrode of the second output reset transistor is electrically connected to the first voltage terminal.

Optionally, the post-frame reset module includes a first reset transistor, a second reset transistor, a third reset transistor and a fourth reset transistor:

A control electrode of the first reset transistor is electrically connected to the post-frame reset control terminal, a first electrode of the first reset transistor is electrically connected to the pull-up node, and a second electrode of the first reset transistor is electrically connected to the first voltage terminal:

A control electrode of the second reset transistor is electrically connected to the post-frame reset control terminal, a first electrode of the second reset transistor is electrically connected to the first driving output terminal, and a second electrode of the second reset transistor is electrically connected to the first voltage terminal:

A control electrode of the third reset transistor is electrically connected to the post-frame reset control terminal, a first electrode of the third reset transistor is electrically connected to the second driving output terminal, and a second electrode of the third reset transistor is electrically connected to the first voltage terminal;

A control electrode of the fourth reset transistor is electrically connected to the post-frame reset control terminal, a first electrode of the fourth reset transistor is electrically connected to the first pull-down node, and a second electrode of the fourth reset transistor is electrically connected to the first voltage terminal.

Optionally, the pre-frame reset module includes a pre-frame reset transistor:

A control electrode of the pre-frame reset transistor is electrically connected to the pre-frame reset control terminal, a first electrode of the pre-frame reset transistor is electrically connected to the pull-up node, and a second electrode of the pre-frame reset transistor is electrically connected to the first voltage terminal.

Figure 10:
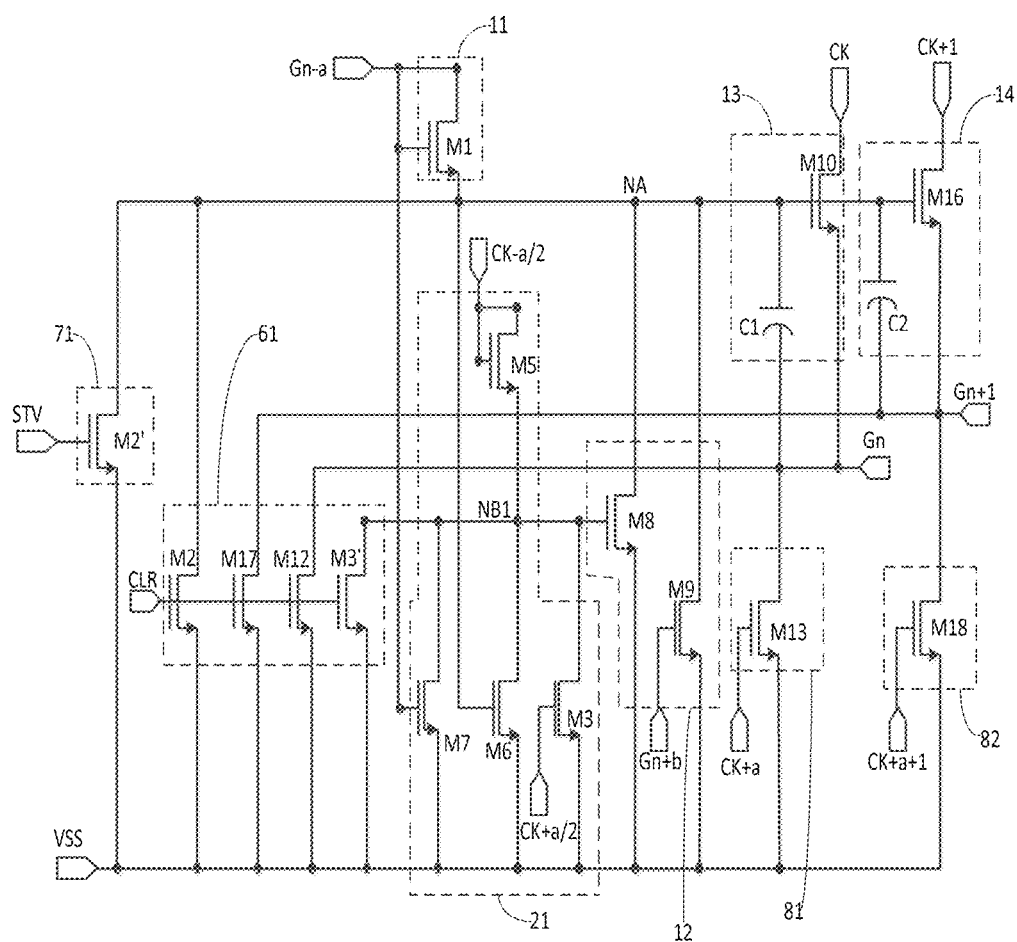
FIG. 10 is a circuit diagram of a driving circuit according to at least one embodiment of the present disclosure.

As shown in FIG. 10, on the basis of at least one embodiment of the driving circuit shown in FIG. 8, The first output module 13 includes a first output transistor M10 and a first capacitor C1, and the second output module 14 includes a second output transistor M16 and a second capacitor C2:

The gate electrode of the first output transistor M10 is electrically connected to the pull-up node NB, the source electrode of the first output transistor M10 is electrically connected to the first output clock signal terminal CK, and the drain electrode of the first output transistor M10 is electrically connected the first driving output terminal Gn:

The first end of the first capacitor C1 is electrically connected to the pull-up node NA, and the second end of the first capacitor C1 is electrically connected to the first driving output terminal Gn:

The gate electrode of the second output transistor M16 is electrically connected to the pull-up node NA, the source electrode of the second output transistor M16 is electrically connected to the second output clock signal terminal CK+1, and the drain electrode of the second output transistor M16 is electrically connected to the second driving output terminal Gn+1;

The first end of the second capacitor C2 is electrically connected to the pull-up node NA, and the second end of the second capacitor C2 is electrically connected to the second driving output end Gn+1:

The pull-up module 12 includes a first pull-up transistor M8 and a second pull-up transistor M9;

The gate electrode of the first pull-up transistor M8 is electrically connected to the first pull-down node NB1, the source electrode of the first pull-up transistor M8 is electrically connected to the pull-up node NA, and the drain electrode of the first pull-up transistor M8 is electrically connected to the low voltage terminal VSS:

The gate electrode of the second pull-up transistor M9 is electrically connected to the pull-up reset terminal Gn+b, the source electrode of the second pull-up transistor M9 is electrically connected to the pull-up node NA, and the drain electrode of the second pull-up transistor M9 is electrically connected to the low voltage terminal VSS;

The input module 11 includes an input transistor M1:

The gate electrode of the input transistor M1 is electrically connected to the input terminal Gn−1, the source electrode of the input transistor M1 is electrically connected to the input terminal Gn−1, and the drain electrode of the input transistor M1 is electrically connected to the pull-up node NA:

The first pull-down module 21 includes a first pull-down transistor M5, a second pull-down transistor M6, a third pull-down transistor M7 and a fourth pull-down transistor M3;

The gate electrode of the first pull-down transistor M5 is electrically connected to the first pull-down control clock signal terminal CK−a/2, and the source electrode of the first pull-down transistor M5 is connected to the first pull-down control clock signal terminal CK−a/2, and the drain electrode of the first pull-down transistor M5 is electrically connected to the first pull-down node NB1:

The gate electrode of the second pull-down transistor M6 is electrically connected to the pull-up node NA, the source electrode of the second pull-down transistor M6 is electrically connected to the first pull-down node NB1, and the drain electrode of the second pull-down transistor M6 is electrically connected to the low voltage terminal VSS:

The gate electrode of the third pull-down transistor M7 is electrically connected to the input terminal Gn-a, the source electrode of the third pull-down transistor M7 is electrically connected to the first pull-down node NB1, and the drain electrode of the third pull-down transistor M7 is electrically connected to the low voltage terminal VSS:

The gate electrode of the fourth pull-down transistor M3 is electrically connected to the second pull-down control clock signal terminal CK+a/2, the source electrode of the fourth pull-down transistor M3 is electrically connected to the first pull-down node NB1, the drain electrode of the fourth pull-down transistor M3 is electrically connected to the low voltage terminal VSS:

The first output reset module 81 includes a first output reset transistor M13, and the second output reset module 82 includes a second output reset transistor M18:

The gate electrode of the first output reset transistor M13 is electrically connected to the first reset control clock signal terminal CK+a, the source electrode of the first output reset transistor M13 is electrically connected to the first driving output terminal Gn, the drain electrode of the first output reset transistor M13 is electrically connected to the low voltage terminal VSS:

The gate electrode of the second output reset transistor M18 is electrically connected to the second reset control clock signal terminal CK+a+1, and the source electrode of the second output reset transistor M18 is connected to the second driving output terminal Gn+1, and the drain electrode of the second output reset transistor M18 is electrically connected to the low voltage terminal VSS:

The post-frame reset module 61 includes a first reset transistor M2, a second reset transistor M12, a third reset transistor M17 and a fourth reset transistor M3':

The gate electrode of the first reset transistor M2 is electrically connected to the post-frame reset control terminal CLR, the source electrode of the first reset transistor M2 is electrically connected to the pull-up node NA, and the drain electrode of the first reset transistor M2 is electrically connected to the first voltage terminal;

The gate electrode of the second reset transistor M12 is electrically connected to the post-frame reset control terminal CLR, the source electrode of the second reset transistor M12 is electrically connected to the first driving output terminal Gn, and the drain electrode of the second reset transistor M12 is electrically connected to the low voltage terminal VSS;

The gate electrode of the third reset transistor M17 is electrically connected to the post-frame reset control terminal CLR, the source electrode of the third reset transistor M17 is electrically connected to the second driving output terminal Gn+1, and the drain electrode of the third reset transistor M17 is electrically connected to the low voltage terminal VSS:

The gate electrode of the fourth reset transistor M3' is electrically connected to the post-frame reset control terminal CLR, the source electrode of the fourth reset transistor M3' is electrically connected to the first pull-down node NB1, and the drain electrode of the fourth reset transistor M3' is electrically connected to the low voltage terminal VSS:

The pre-frame reset module 71 includes a pre-frame reset transistor M2';

The gate electrode of the pre-frame reset transistor M2' is electrically connected to the pre-frame reset control terminal STV, the source electrode of the pre-frame reset transistor M2' is electrically connected to the pull-up node NA, and the drain electrode of the pre-frame reset transistor M2' is electrically connected to the low voltage terminal VSS.

In at least one embodiment of the driving circuit shown in FIG. 10, all transistors are n-type thin film transistors, but not limited thereto.

In at least one embodiment of the driving circuit shown in FIG. 10, the first pull-down control terminal is the first pull-down control clock signal terminal CK−a/2, but not limited thereto.

In at least one embodiment of the driving circuit shown in FIG. 10, the first voltage terminal is the low voltage terminal VSS, but not limited thereto.

In at least one embodiment of the driving circuit shown in FIG. 10, the gate electrode of M1 and the source electrode of M1 are both electrically connected to the input terminal Gn−a, but in actual operation, the source electrode of M1 can be connected to a high voltage terminal instead, but not limited to this.

Figure 11:
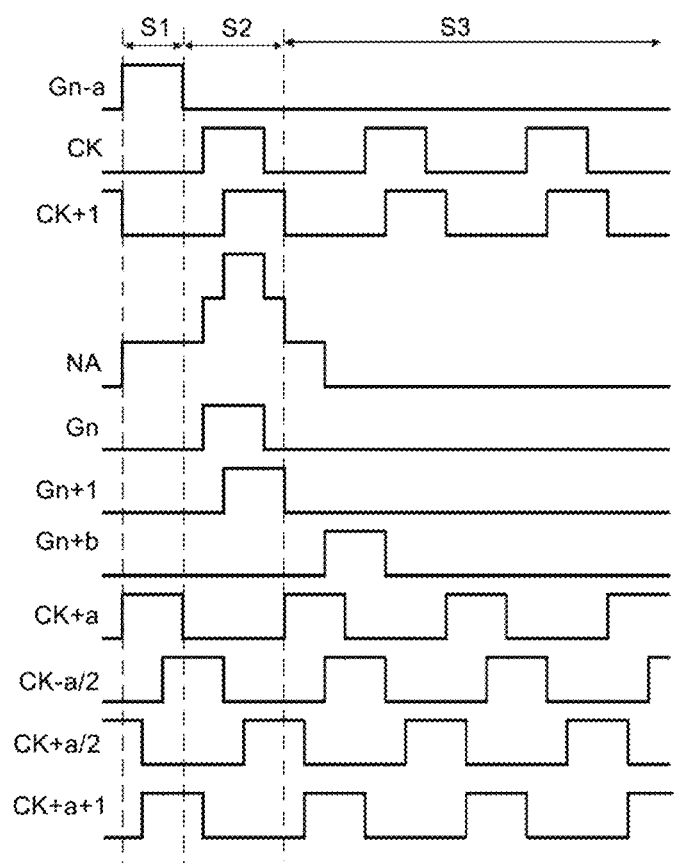
FIG. 11 is a timing diagram of the driving circuit shown in FIG. 10 according to at least one embodiment of the present disclosure.

As shown in FIG. 11, when at least one embodiment of the driving circuit shown in FIG. 10 of the present disclosure is in operation, the display period may include an input phase S1, an output phase S2 and a reset phase S3 which are set successively:

In the input phase S1, Gn−a outputs a high voltage signal, CK provides a low voltage signal, CK+1 provides a low voltage signal, M1 is turned on to pull up the potential of NA to a high voltage, and M7 is turned on to pull down the potential of NB to a low voltage: M10 and M16 are turned on, so that Gn and CK are connected, Gn+1 and CK+1 are connected, and both Gn and Gn+1 output a low-voltage signal:

In the input phase S1, CK+a outputs a high voltage signal, M13 is turned on, and Gn is connected to the low voltage terminal VSS;

In the output phase S2, Gn−1 outputs a low voltage signal, and M1 is turned off;

At the beginning of the output phase S2, the potential of the first output clock signal provided by CK jumps from a low voltage to a high voltage, and C1 increases the potential of NA by bootstrapping:

After the output phase S2 starts for a period of time, the potential of the second output clock signal provided by CK+1 jumps from a low voltage to a high voltage, and C2 increases the potential of NA again by bootstrapping:

In the output phase S2, after a period of time, the potential of the first output clock signal provided by CK jumps from a high voltage to a low voltage, and C1 correspondingly pulls down the potential of NA:

In the output phase S2, after a period of time, the potential of the second output clock signal provided by CK+1 jumps from a high voltage to a low voltage, and C2 correspondingly pulls down the potential of NA:

In the output phase S2, both M10 and M16 are turned on, Gn and CK are connected, and Gn+1 is connected to CK+1:

In the output phase S2, when CK outputs a high voltage signal, Gn outputs a high voltage signal, and when CK+1 outputs a high voltage signal, Gn+1 outputs a high voltage signal;

In the input phase S1 and the output phase S2, under the control of the potential of NA, M6 is turned on to pull down the potential of NB1:

In the input phase S1 and the output phase S2, when CK+a/2 outputs a high voltage signal, M3 is turned on to pull down the potential of NB1:

At the beginning of the reset phase S3, CK+a outputs a high voltage signal, M13 is turned on to control to connect Gn and the low voltage terminal VSS:

In the reset phase S3, when CK+a+1 outputs a high voltage signal, M18 is turned on to control to connect Gn+1 and the low voltage terminal VSS:

In the reset phase S3, when Gn+b outputs a high voltage signal, M9 is turned on to control to connect NA and the low voltage terminal VSS, so as to pull down the potential of NA to a low voltage:

In the reset phase S3, when CK−a/2 outputs a high voltage signal and CK+a/2 outputs a low voltage signal, the potential of NA is a low voltage, M5 is turned on, M6 is turned off, M3 is turned off, and the potential of NB is a high voltage, so that M8 is turned on to pull down the potential of NA.

During operation of at least one embodiment of the driving circuit shown in FIG. 10 of the present disclosure, after one frame of display time ends, the CLR provides a high voltage signal, and M2, M17, M12 and M3' are all turned on to control to connect NA and low voltage terminal VSS, the control to connect Gn and the low-voltage terminal VSS, control to connect Gn+1 and the low-voltage terminal VSS, control to connect NB1 and the low-voltage terminal VSS, and reset the potential of NA, the potential of the first gate driving signal outputted by Gn, the second gate driving signal outputted by Gn+1 and the potential of NB1:

Before the display time of one frame starts, STV provides a high voltage signal, M2' is turned on, so that NA is connected to the low voltage terminal VSS, and the potential of NA is reset.

Figure 12:
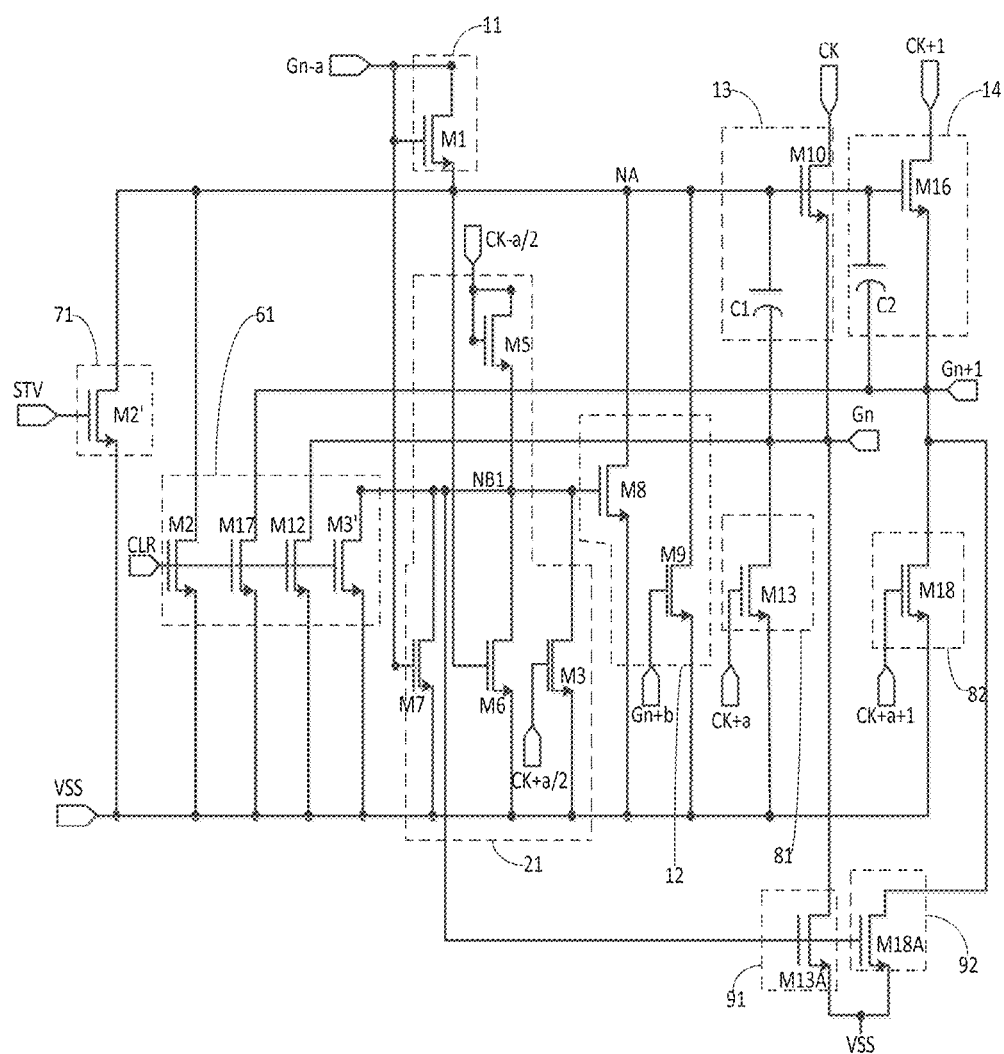
FIG. 12 is a circuit diagram of a driving circuit according to at least one embodiment of the present disclosure.

As shown in FIG. 12, based on at least one embodiment of the driving circuit shown in FIG. 10, the driving circuit described in at least one embodiment of the present disclosure may further include a first output pull-down module 91 and a second output pull-down module 92:

The first output pull-down module 91 includes a first output pull-down transistor M13A, and the second output pull-down module 92 includes a second output pull-down transistor M18B:

The gate electrode of the first output pull-down transistor M13A is electrically connected to the first pull-down node NB1, the source electrode of the first output pull-down transistor M13A is electrically connected to the first driving output terminal Gn, and the drain electrode of the first output pull-down transistor M13A is electrically connected to the low voltage terminal VSS:

The gate electrode of the second output pull-down transistor M18B is electrically connected to the first pull-down node NB1, the source electrode of the second output pull-down transistor M18B is electrically connected to the second driving output terminal Gn+1, and the drain electrode of the second output pull-down transistor M18B is electrically connected to the low voltage terminal VSS.

In at least one embodiment of the driving circuit shown in FIGS. 12, M13 and M18 may be n-type thin film transistors, but not limited thereto.

In at least one embodiment of the driving circuit shown in FIG. 12, all transistors are n-type thin film transistors, but not limited thereto.

In at least one embodiment of the driving circuit shown in FIG. 12, the first pull-down control terminal is the first pull-down control clock signal terminal CK−a/2, but not limited thereto.

In at least one embodiment of the driving circuit shown in FIG. 12, the first voltage terminal is the low voltage terminal VSS, but not limited thereto.

When at least one embodiment of the driving circuit shown in FIG. 12 of the present disclosure is in operation, when the potential of NB1 is a high voltage, both M13 and M18 are turned on, so that both Gn and Gn+1 output a low voltage signal.

In at least one embodiment of the present disclosure, the driving circuit may further include a third output module:

The third output module is electrically connected to the pull-up node, the third driving output terminal and the third output clock signal terminal, and is configured to control to connect the third driving output terminal and the third output clock signal terminal under the control of the potential of the pull-up node, and control the third driving output terminal to output a third gate driving signal.

During specific implementation, the first output module, the second output module and the third output module share the pull-up node, and under the control of the potential of the pull-up node, control the first gate driving signal outputted by the first driving output terminal, the second gate driving signal outputted by the second driving output terminal, and the third gate driving signal outputted by the third driving output terminal, so as to realize the output of the three stages of gate driving signals, and reduce the number of transistors at the same time, which is conducive to realizing a narrow frame.

The driving circuit described in at least one embodiment of the present disclosure may further include a third output reset module:

The third output reset module includes a third output reset transistor:

A control electrode of the third output reset transistor is electrically connected to the third reset control clock signal terminal, a first electrode of the third output pull-down transistor is electrically connected to the third driving output terminal, and a second electrode of the third output pull-down transistor is electrically connected to the first voltage terminal.

During specific implementation, the driving circuit described in at least one embodiment of the present disclosure may reset the potential of the third gate driving signal outputted by the third driving output terminal under the control of the third reset control clock signal through the third output reset module.

The driving circuit described in at least one embodiment of the present disclosure may further include a post-frame reset module:

The post-frame reset module is respectively electrically connected to the post-frame reset control terminal, the third driving output terminal and the first voltage terminal, and is configured to control to connect the third driving output terminal and the first voltage terminal under the control of the post-frame reset control signal provided by the post-frame reset control terminal.

In a specific implementation, after the display time of one frame ends, the post-frame reset control terminal controls to connect the third driving output terminal and the first voltage terminal under the control of the post-frame reset control signal, so as to reset the potential of the third gate driving signal outputted by the third driving output terminal.

Figure 13:
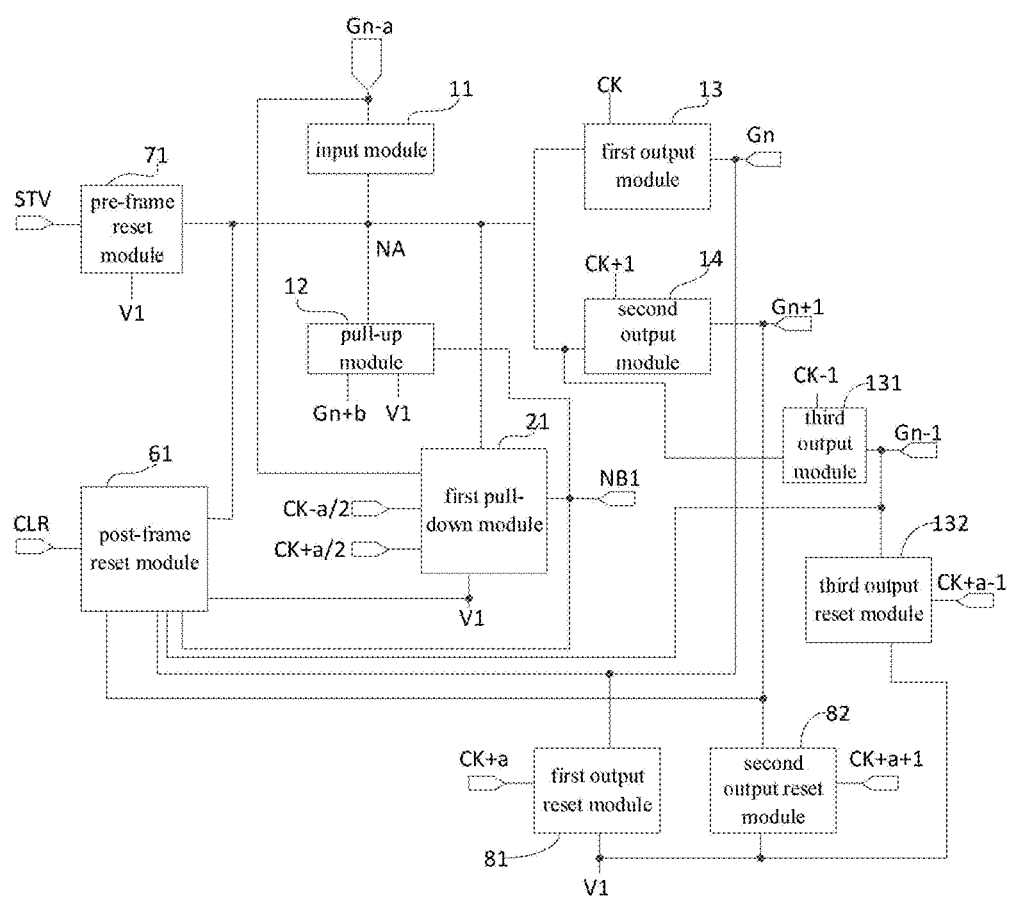
FIG. 13 is a structural diagram of a driving circuit according to at least one embodiment of the present disclosure.

As shown in FIG. 13, based on at least one embodiment of the driving circuit shown in FIG. 8, the driving circuit described in at least one embodiment of the present disclosure may further include a third output module 131 and a third output reset module 132:

The third output module 131 is electrically connected to the pull-up node NA, the third driving output terminal Gn−1 and the third output clock signal terminal CK−1, is configured to control to connect the third driving output terminal Gn−1 and the third output clock signal terminal CK−1 under the control of the potential of the pull-up node NA, and control the third driving output terminal Gn−1 to output a third gate driving signal;

The third output reset module 132 is respectively electrically connected to the third reset control clock signal terminal CK+a−1, the third driving output terminal Gn−1 and the first voltage terminal V1, and is configured to control to connect the third driving output terminal Gn−1 and the first voltage terminal V1 under the control of the third reset control clock signal provided by the third reset control clock signal terminal CK+a−1:

The post-frame reset module 61 is also electrically connected the third driving output terminal Gn−1 and the first voltage terminal V1 under the control of the post-frame reset control signal provided by the post-frame reset control terminal CLR.

Optionally, the third output module includes a third output transistor:

A control electrode of the third output transistor is electrically connected to the pull-up node, a first electrode of the third output transistor is electrically connected to the third output clock signal terminal, and a second electrode of the third output transistor is electrically connected to the third driving output terminal.

Optionally, the third output reset module includes a third output reset transistor:

A control electrode of the third output reset transistor is electrically connected to the third reset control clock signal terminal, a first electrode of the third output pull-down transistor is electrically connected to the third driving output terminal, and a second electrode of the third output pull-down transistor is electrically connected to the first voltage terminal.

Optionally, the post-frame reset module further includes a fifth reset transistor:

A control electrode of the fifth reset transistor is electrically connected to the post-frame reset control terminal, a first electrode of the fifth reset transistor is electrically connected to the third driving output terminal, and a second electrode of the fifth reset transistor is electrically connected to the first voltage terminal.

Figure 14:
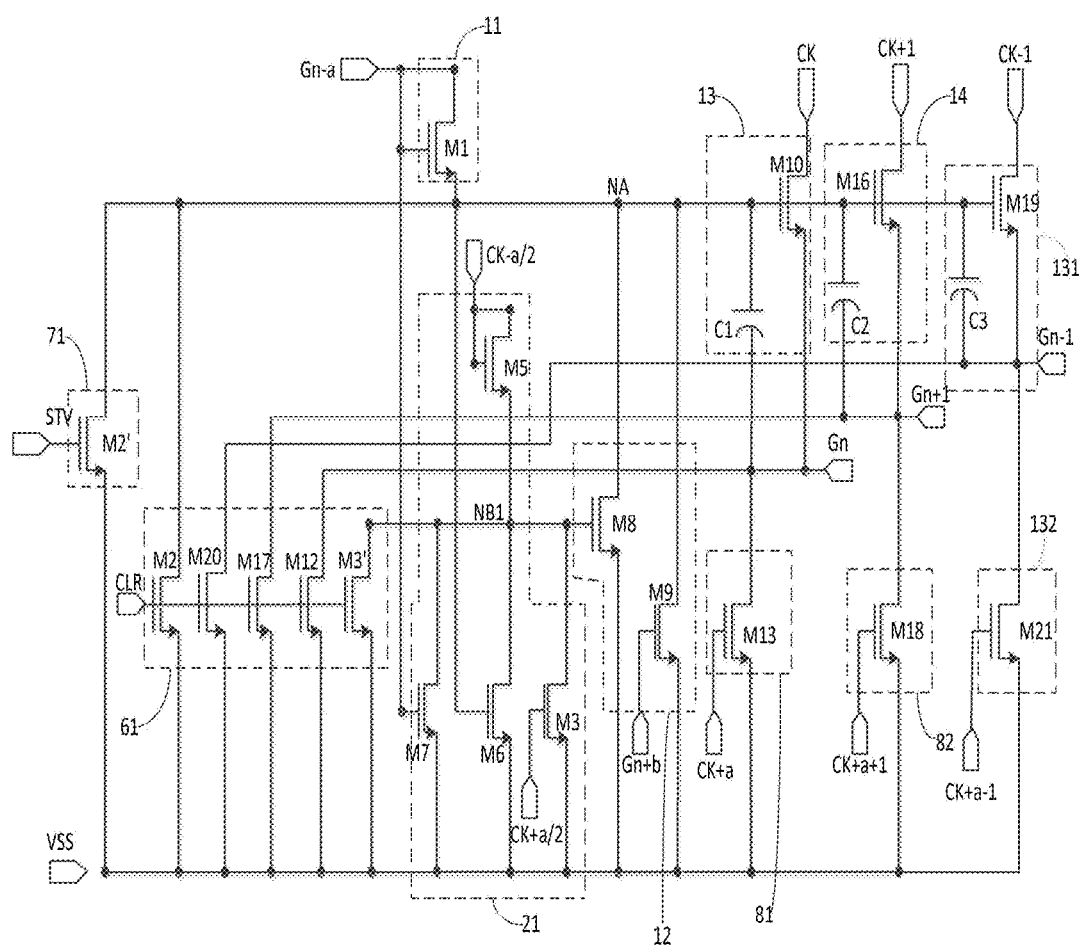
FIG. 14 is a circuit diagram of a driving circuit according to at least one embodiment of the present disclosure.

As shown in FIG. 14, on the basis of at least one embodiment of the driving circuit shown in FIG. 10, the driving circuit described in at least one embodiment of the present disclosure further includes a third output module 131 and a third output reset module 132:

The third output module 131 includes a third output transistor M19 and a third capacitor C3, the third output reset module 132 includes a third output reset transistor M21, and the post-frame reset module 61 further includes a fifth reset transistor M20;

The gate electrode of the third output transistor M19 is electrically connected to the pull-up node NA, the source electrode of the third output transistor M19 is electrically connected to the third output clock signal terminal CK−1, and the drain electrode of the third output transistor M19 is electrically connected to the third driving output terminal Gn−1:

The first end of the third capacitor C3 is electrically connected to the pull-up node NA, and the second end of the third capacitor C3 is electrically connected to the third driving output end Gn−1:

The gate electrode of the third output reset transistor M21 is electrically connected to the third reset control clock signal terminal CK+a−1, and the source electrode of the third output pull-down transistor M21 is connected to the third driving output terminal Gn−1, and the drain electrode of the third output pull-down transistor M21 is electrically connected to the low voltage terminal VSS:

The gate electrode of the fifth reset transistor M20 is electrically connected to the post-frame reset control terminal CLR, the source electrode of the fifth reset transistor M20 is electrically connected to the third driving output terminal Gn−1, and the drain electrode of the fifth reset transistor M20 is electrically connected to the low voltage terminal VSS.

In at least one embodiment of the driving circuit shown in FIG. 14, all transistors are n-type thin film transistors, but not limited thereto.

In at least one embodiment of the driving circuit shown in FIG. 14, the first voltage terminal is the low voltage terminal VSS, but not limited thereto.

In at least one embodiment of the driving circuit shown in FIG. 14, the first pull-down control terminal is the first pull-down control clock signal terminal CK−a/2, but not limited thereto.

Figure 15:
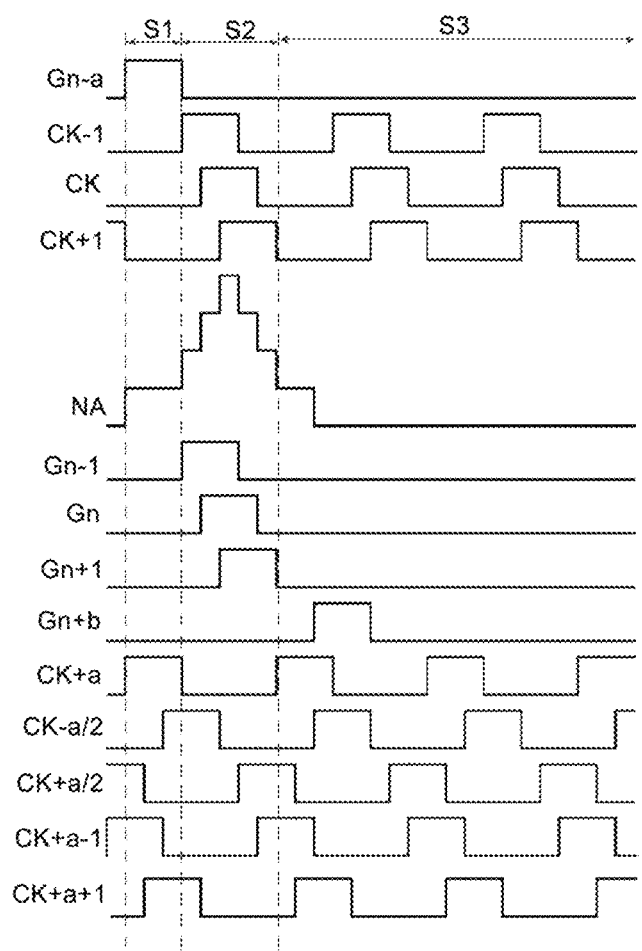
FIG. 15 is a timing diagram of the driving circuit shown in FIG. 14 according to at least one embodiment of the present disclosure.

As shown in FIG. 15, when at least one embodiment of the driving circuit shown in FIG. 14 of the present disclosure is in operation, the display period may include an input phase S1, an output phase S2 and a reset phase S3 which are set successively:

In the input phase S1, Gn−a outputs a high voltage signal, CK provides a low voltage signal, CK+1 provides a low voltage signal, CK−1 provides a low voltage signal, M1 is turned on to pull up the potential of NA to a high voltage, M7 is turned on to pull down the potential of NB to a low voltage: M10, M16 and M19 are turned on to connect Gn and CK, connect Gn+1 and CK+1, connect Gn−1 and CK−1, Gn, Gn+1 and Gn−1 all output a low voltage signal;

In the input phase S1, CK+a outputs a high voltage signal, M13 is turned on, and Gn is connected to the low voltage terminal VSS:

In the output phase S2, Gn−1 outputs a low voltage signal, and M1 is turned off:

At the beginning of the output phase S2, the potential of the third output clock signal provided by CK−1 jumps from a low voltage to a high voltage, and C3 increases the potential of NA by bootstrapping:

After the output phase S2 starts for a period of time, the potential of the first output clock signal provided by CK jumps from a low voltage to a high voltage, and C1 increases the potential of NA again by bootstrapping:

In the output phase S2, after a period of time, the potential of the second output clock signal provided by CK+1 jumps from a low voltage to a high voltage, and C2 increases the potential of NA again by bootstrapping:

In the output phase S2, after a period of time, the potential of the third output clock signal provided by CK−1 jumps from a high voltage to a low voltage, and C3 correspondingly pulls down the potential of NA:

In the output phase S2, after a period of time, the potential of the first output clock signal provided by CK jumps from a high voltage to a low voltage, and C1 correspondingly pulls down the potential of NA:

In the output phase S2, after a period of time, the potential of the second output clock signal provided by CK+1 jumps from a high voltage to a low voltage, and C2 correspondingly pulls down the potential of NA:

In the output phase S2, M10, M16 and M19 are all turned on, Gn and CK are connected, Gn+1 is connected to CK+1, and Gn−1 is connected to CK−1:

In the output phase S2, when CK outputs a high voltage signal, Gn outputs a high voltage signal, when CK+1 outputs a high voltage signal, Gn+1 outputs a high voltage signal, and when CK−1 outputs a high voltage signal, Gn−1 outputs a high voltage signal:

In the input phase S1 and the output phase S2, under the control of the potential of NA, M6 is turned on to pull down the potential of NB1:

In the input phase S1 and the output phase S2, when CK+a/2 outputs a high voltage signal, M3 is turned on to pull down the potential of NB1:

At the beginning of the reset phase S3, CK+a outputs a high voltage signal, M13 is turned on, to control to connect Gn and the low voltage terminal VSS:

In the reset phase S3, when CK+a+1 outputs a high voltage signal, M18 is turned on to control to connect Gn+1 and the low voltage terminal VSS:

In the reset phase S3, when CK+a−1 outputs a high voltage signal, M21 is turned on to control to connect Gn−1 and the low voltage terminal VSS:

In the reset phase S3, when Gn+b outputs a high voltage signal, M9 is turned on to control to connect NA and the low voltage terminal VSS, so as to pull down the potential of NA to a low voltage:

In the reset phase S3, when CK−a/2 outputs a high voltage signal and CK+a/2 outputs a low voltage signal, the potential of NA is a low voltage, M5 is turned on, M6 is turned off, M3 is turned off, and the potential of NB is a high voltage, so that M8 is turned on to pull down the potential of NA.

During operation of at least one embodiment of the driving circuit shown in FIG. 14 of the present disclosure, after one frame of display time ends, the CLR provides a high voltage signal, and M2, M20, M17, M12 and M3' are all turned on to control to connect NA and the low voltage terminal VSS, control to connect Gn and the low voltage terminal VSS, control to connect Gn+1 to the low voltage terminal VSS, control to connect Gn−1 to the low voltage terminal VSS, and control to connect NB1 to the low voltage terminal VSS, and reset the potential of NA, the first gate driving signal outputted by Gn, the second gate driving signal outputted by Gn+1, the third gate driving signal outputted by Gn−1 and the potential of NB1:

Before one frame of display time starts, STV provides a high voltage signal, M2' is turned on, so that NA and the low voltage terminal VSS are connected, and the potential of NA is reset.

In at least one embodiment of the present disclosure, the driving circuit may further include a second pull-down node and a second pull-down module: the first pull-down control terminal is a first control voltage terminal: the first control voltage terminal is configured to provide the first control voltage:

The second pull-down module is respectively electrically connected to the second pull-down node, the pull-up node, the input terminal, the second control voltage terminal and the first voltage terminal, and is configured to control to connect the second pull-down node and the first voltage terminal under the control of the potential of the pull-up node, control the potential of the second pull-down node under the control of the second control voltage provided by the second control voltage terminal, and control to connect the second pull-down node and the first voltage terminal under the control of the input signal provided by the input terminal.

During specific implementation, the driving circuit described in at least one embodiment of the present disclosure may adopt two pull-down nodes, the first pull-down module controls the potential of the first pull-down node, the second pull-down module controls the potential of the second pull-down node. The potential of the first pull-down node and the potential of the second pull-down node are alternately a high voltage, so as to control the transistor whose gate electrode is electrically connected to the first pull-down node, and the transistor whose gate electrode is electrically connected to the second pull-down node to operate alternately, thereby reducing the characteristic drift phenomenon of each transistor and improving the working stability of the driving circuit.

In at least one embodiment of the present disclosure, at predetermined time intervals, the first control voltage terminal and the second control voltage terminal alternately provide a high voltage signal: when the first control voltage terminal provides a high voltage signal, the second control voltage terminal provides a low voltage signal: when the second control voltage terminal provides a high voltage signal, the first control voltage terminal provides a low voltage signal.

Optionally, the second pull-down module includes a fifth pull-down transistor, a sixth pull-down transistor, and a seventh pull-down transistor:

A control electrode of the fifth pull-down transistor is electrically connected to the second control voltage terminal, a first electrode of the fifth pull-down transistor is electrically connected to the second control voltage terminal or the second voltage terminal, and a second electrode of the fifth pull-down transistor is electrically connected to the second pull-down node:

A control electrode of the sixth pull-down transistor is electrically connected to the pull-up node, a first electrode of the sixth pull-down transistor is electrically connected to the second pull-down node, and a second electrode of the sixth pull-down transistor is electrically connected to the first voltage terminal:

A control electrode of the seventh pull-down transistor is electrically connected to the input terminal, a first electrode of the seventh pull-down transistor is electrically connected to the second pull-down node, and a second electrode of the seventh pull-down transistor is electrically connected to the first voltage terminal.

The driving circuit according to at least one embodiment of the present disclosure may further include a second pull-down node:

The first output pull-down module is also electrically connected to the second pull-down node, and is configured to control to connect the first driving output terminal and the first voltage terminal under the control of the potential of the second pull-down node:

The second output pull-down module is also electrically connected to the second pull-down node, and is configured to control to connect the second driving output terminal and the first voltage terminal under the control of the potential of the second pull-down node.

In a specific implementation, when the driving circuit further includes a second pull-down node, the first output pull-down module is also configured to reset the potential of the gate driving signal under the control of the potential of the second pull-down node, to reset the potential of the second gate driving signal outputted by the second driving output terminal under the control of the potential of the second pull-down node.

In at least one embodiment of the present disclosure, the driving circuit may further include a second pull-down node:

The pull-up module is further electrically connected to the second pull-down node, and is configured to control to connect the pull-up node and the first voltage terminal under the control of the potential of the second pull-down node.

In a specific implementation, when the driving circuit further includes a second pull-down node, the pull-up module also resets the potential of the pull-up node under the control of the potential of the second pull-down node.

The driving circuit according to at least one embodiment of the present disclosure may further include a second pull-down node:

The post-frame reset module is further electrically connected to the second pull-down node, and is configured to control to connect the second pull-down node and the first voltage terminal under the control of the post-frame reset control signal.

In a specific implementation, when the driving circuit further includes a second pull-down node, after a frame of display time ends, the post-frame reset module is also configured to reset the potential of the pull-down node under the control of the post-frame reset control signal.

The difference between at least one embodiment of the driving circuit shown in FIG. 16 and at least one embodiment shown in FIG. 9 is as follows: the first pull-down control terminal is the first control voltage terminal LC1, and the first control voltage terminal is configured to provide a first control voltage; the first pull-down module 21 is not electrically connected to the second pull-down control clock signal terminal CK+a/2:

The first pull-down module 21 is electrically connected to the first control voltage terminal LC1, is configured to control the potential of the first pull-down node NB1 under the control of the first control voltage provided by the first control voltage terminal LC1:

The driving circuit described in at least one embodiment of the present disclosure may further include a second pull-down node NB2 and a second pull-down module 151:

The second pull-down module 151 is respectively electrically connected to the second pull-down node NB2, the pull-up node NA, the input terminal Gn–a, the second control voltage terminal LC2 and the first voltage terminal V1, is configured to control to connect the second pull-down node NB2 and the first voltage terminal V1 under the control of the potential of the pull-up node NA, control the potential of the second pull-down node NB2 under the control of the second control voltage provided by the second control voltage terminal LC2, and control to connect the second pull-down node NB2 and the first voltage terminal V1 under the control of the input signal provided by the input terminal Gn–a;

The first output pull-down module 91 is also electrically connected to the second pull-down node NB2, is configured to control to connect the first driving output terminal Gn and the first voltage terminal V1 under the control of the potential of the second pull-down node NB2:

The second output pull-down module 92 is also electrically connected to the second pull-down node NB2, is configured to control to connect the second driving output terminal Gn+1 and the first voltage terminal V1 under the control of the potential of the second pull-down node NB2:

The pull-up module 12 is also electrically connected to the second pull-down node NB2, and is configured to control to connect the pull-up node NA and the first voltage terminal V1 under the control of the potential of the second pull-down node NB2:

The post-frame reset module 61 is also electrically connected to the second pull-down node NB2, and is configured to control to connect the second pull-down node NB2 and the first voltage terminal V1 under the control of the post-frame reset control signal.

Optionally, the first output pull-down module further includes a third output pull-down transistor, and the second output pull-down module further includes a fourth output pull-down transistor; a control electrode of the third output pull-down transistor is connected to the second pull-down node, a first electrode of the third output pull-down transistor is electrically connected to the first driving output terminal, and a second electrode of the third output pull-down transistor is electrically connected to the first voltage terminal:

A control electrode of the fourth output pull-down transistor is electrically connected to the second pull-down node, a first electrode of the fourth output pull-down transistor is electrically connected to the second driving output terminal, and a second electrode of the fourth output pull-down transistor is electrically connected to the first voltage terminal.

Optionally, the pull-up module further includes a third pull-up transistor:

A control electrode of the third pull-up transistor is electrically connected to the second pull-down node, a first electrode of the third pull-up transistor is electrically connected to the pull-up node, and a second electrode of the third pull-up transistor is electrically connected to the first voltage terminal.

Optionally, the post-frame reset module further includes a sixth reset transistor:

A control electrode of the sixth reset transistor is electrically connected to the post-frame reset control terminal, a first electrode of the sixth reset transistor is electrically connected to the second pull-down node, and a second electrode of the sixth reset transistor is electrically connected to the first voltage terminal.

Figure 16:
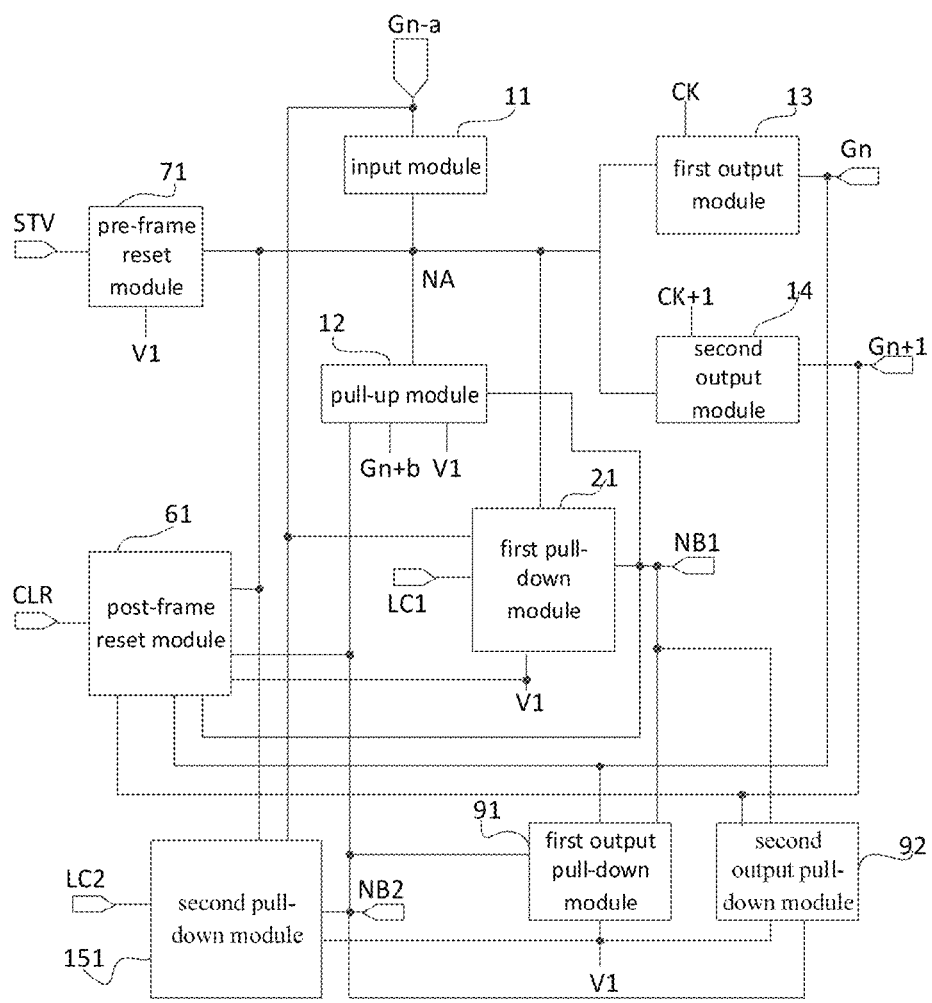
FIG. 16 is a structural diagram of a driving circuit according to at least one embodiment of the present disclosure.
Figure 17:
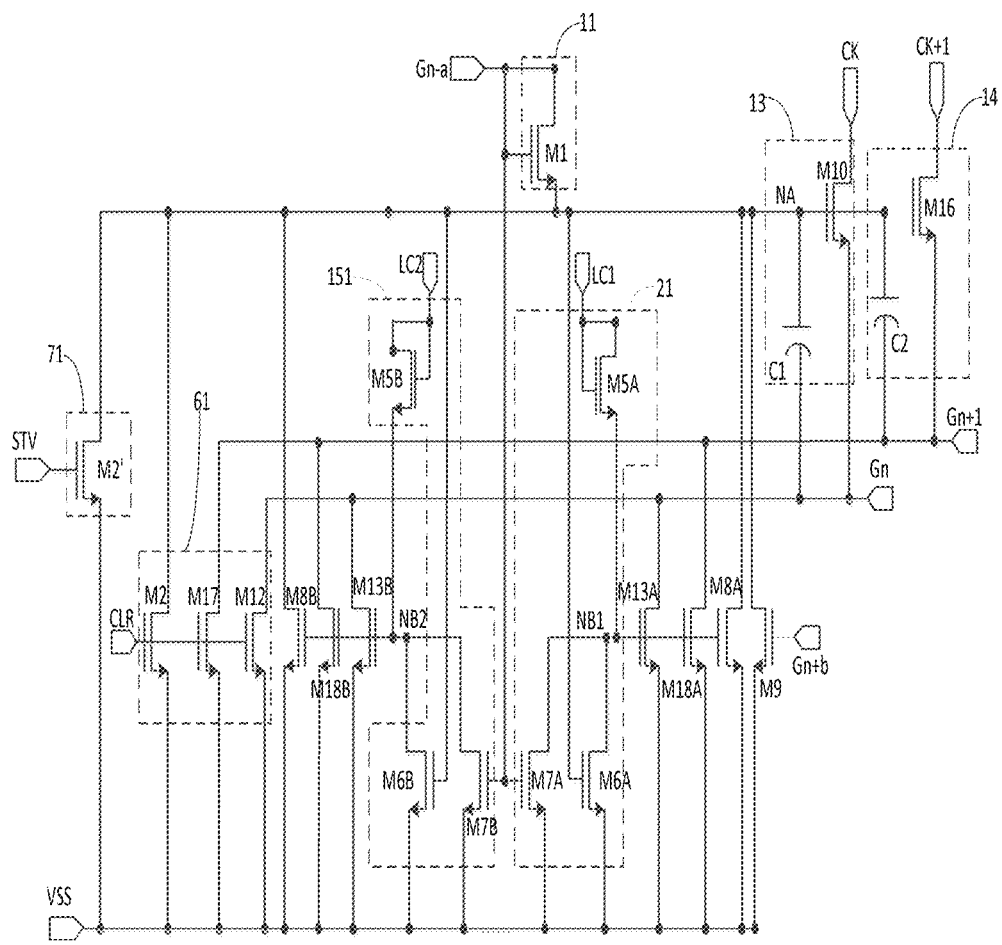
FIG. 17 is a circuit diagram of a driving circuit according to at least one embodiment of the present disclosure.

As shown in FIG. 17, on the basis of at least one embodiment of the driving circuit shown in FIG. 16, The first output module 13 includes a first output transistor M10 and a first capacitor C1, and the second output module 14 includes a second output transistor M16 and a second capacitor C2:

The gate electrode of the first output transistor M10 is electrically connected to the pull-up node NB, the source electrode of the first output transistor M10 is electrically connected to the first output clock signal terminal CK, and the drain electrode of the first output transistor M10 is electrically connected to the first driving output terminal Gn:

The first end of the first capacitor C1 is electrically connected to the pull-up node NA, and the second end of the first capacitor C1 is electrically connected to the first driving output terminal Gn:

The gate electrode of the second output transistor M16 is electrically connected to the pull-up node NA, the source electrode of the second output transistor M16 is electrically connected to the second output clock signal terminal CK+1, and the drain electrode of the second output transistor M16 is electrically connected to the second driving output terminal Gn+1:

The first end of the second capacitor C2 is electrically connected to the pull-up node NA, and the second end of the second capacitor C2 is electrically connected to the second driving output terminal Gn+1:

The pull-up module includes a first pull-up transistor M8A, a second pull-up transistor M9 and a third pull-up transistor M8B:

The gate electrode of the first pull-up transistor M8A is electrically connected to the first pull-down node NB1, the source electrode of the first pull-up transistor M8A is electrically connected to the pull-up node NA, and the drain electrode of the first pull-up transistor M8A is electrically connected to the low voltage terminal VSS:

The gate electrode of the second pull-up transistor M9 is electrically connected to the pull-up reset terminal Gn+b, the source electrode of the second pull-up transistor M9 is electrically connected to the pull-up node NA, and the drain electrode of the second pull-up transistor M9 is electrically connected to the low voltage terminal VSS:

The gate electrode of the third pull-up transistor M8B is electrically connected to the second pull-down node NB2, the source electrode of the third pull-up transistor M8B is electrically connected to the pull-up node NA, and the drain electrode of the third pull-up transistor M8B is electrically connected to the low voltage terminal VSS:

The input module 11 includes an input transistor M1:

The gate electrode of the input transistor M1 is electrically connected to the input terminal Gn–1, the source electrode of the input transistor M1 is electrically connected to the input terminal Gn−1, and the drain electrode of the input transistor M1 is electrically connected to the pull-up node NA:

The first pull-down module 21 includes a first pull-down transistor M5A, a second pull-down transistor M6A and a third pull-down transistor M7A:

The gate electrode of the first pull-down transistor M5A is electrically connected to the first control voltage terminal LC1, the source electrode of the first pull-down transistor M5A is electrically connected to the first control voltage terminal LC1, and the drain electrode of the first pull-down transistor M5A is electrically connected to the first pull-down node NB1;

The gate electrode of the second pull-down transistor M6A is electrically connected to the pull-up node NA, the source electrode of the second pull-down transistor M6A is electrically connected to the first pull-down node NB1, and the drain electrode of the second pull-down transistor M6A is electrically connected to the low voltage terminal VSS:

The gate electrode of the third pull-down transistor M7A is electrically connected to the input terminal Gn-a, the source electrode of the third pull-down transistor M7A is electrically connected to the first pull-down node NB1, and the drain electrode of the third pull-down transistor M7A is electrically connected to the low voltage terminal VSS:

The second pull-down module 151 includes a fifth pull-down transistor M5B, a sixth pull-down transistor M6B and a seventh pull-down transistor M7B:

The gate electrode of the fifth pull-down transistor M5B is electrically connected to the second control voltage terminal LC2, the source electrode of the fifth pull-down transistor M5B is electrically connected to the second control voltage terminal LC2, and the drain electrode of the fifth pull-down transistor M5B is electrically connected to the second pull-down node NB2:

The gate electrode of the sixth pull-down transistor M6B is electrically connected to the pull-up node NA, the source electrode of the sixth pull-down transistor M6B is electrically connected to the second pull-down node NB2, and the drain electrode of the sixth pull-down transistor M6B is electrically connected to the low voltage terminal VSS:

The gate electrode of the seventh pull-down transistor M7B is electrically connected to the input terminal Gn-a, the source electrode of the seventh pull-down transistor M7B is electrically connected to the second pull-down node NB2, and the drain electrode of the seventh pull-down transistor M7B is electrically connected to the low voltage terminal VSS:

The first output pull-down module includes a first output pull-down transistor M13A, and the second output pull-down module includes a second output pull-down transistor M18A:

The gate electrode of the first output pull-down transistor M13A is electrically connected to the first pull-down node NB1, the source electrode of the first output pull-down transistor M13A is electrically connected to the first driving output terminal Gn, and the drain electrode of the first output pull-down transistor M13A is electrically connected to the low voltage terminal VSS:

The gate electrode of the second output pull-down transistor M18A is electrically connected to the first pull-down node NB1, the source electrode of the second output pull-down transistor M18A is electrically connected to the second driving output terminal Gn+1, and the drain electrode of the second output pull-down transistor M18A is electrically connected to the low voltage terminal VSS:

The post-frame reset module 61 includes a first reset transistor M2, a second reset transistor M12 and a third reset transistor M17:

The gate electrode of the first reset transistor M2 is electrically connected to the post-frame reset control terminal CLR, the source electrode of the first reset transistor M2 is electrically connected to the pull-up node NA, and the drain electrode of the first reset transistor M2 is electrically connected to the first voltage terminal:

The gate electrode of the second reset transistor M12 is electrically connected to the post-frame reset control terminal CLR, the source electrode of the second reset transistor M12 is electrically connected to the first driving output terminal Gn, and the drain electrode of the second reset transistor M12 is electrically connected to the low voltage terminal VSS:

The gate electrode of the third reset transistor M17 is electrically connected to the post-frame reset control terminal CLR, the source electrode of the third reset transistor M17 is electrically connected to the second driving output terminal Gn+1, and the drain electrode of the third reset transistor M17 is electrically connected to the low voltage terminal VSS:

The pre-frame reset module 71 includes a pre-frame reset transistor M2':

The gate electrode of the pre-frame reset transistor M2' is electrically connected to the pre-frame reset control terminal STV, the source electrode of the pre-frame reset transistor M2' is electrically connected to the pull-up node NA, and the drain electrode of the pre-frame reset transistor M2' is electrically connected to the low voltage terminal VSS;

The first output pull-down module further includes a third output pull-down transistor M13B, and the second output pull-down module further includes a fourth output pull-down transistor M18B:

The gate electrode of the third output pull-down transistor M13B is electrically connected to the second pull-down node NB2, the source electrode of the third output pull-down transistor M13B is electrically connected to the first driving output terminal Gn, and the drain electrode of the third output pull-down transistor M13B is electrically connected to the low voltage terminal VSS:

The gate electrode of the fourth output pull-down transistor M18B is electrically connected to the second pull-down node NB2, the source electrode of the fourth output pull-down transistor M18B is electrically connected to the second driving output terminal Gn+1, and the drain electrode of the fourth output pull-down transistor M18B is electrically connected to the low voltage terminal VSS.

In at least one embodiment of the driving circuit shown in FIG. 17, all transistors are n-type thin film transistors, but not limited thereto.

In at least one embodiment of the driving circuit shown in FIG. 17, the first voltage terminal is the low voltage terminal VSS, but not limited thereto.

In at least one embodiment of the driving circuit shown in FIG. 17, the first pull-down control terminal is the first control voltage terminal LC1, but not limited thereto.

In at least one embodiment of the driving circuit shown in FIG. 17, M5A, M6A and M7A form an inverter, and form a pull-down maintenance module (responsible for noise reduction) together with M8A, M13A and M18A: M5B, M6B and M7B form another inverter, form another pull-down maintenance module (responsible for noise reduction) together with M8B, M13B and M18B; the two pull-down maintenance modules work alternately to control the potential of NA to a low voltage during the reset phase, and control Gn and Gn+1 to provide a low voltage signal.

Figure 18:
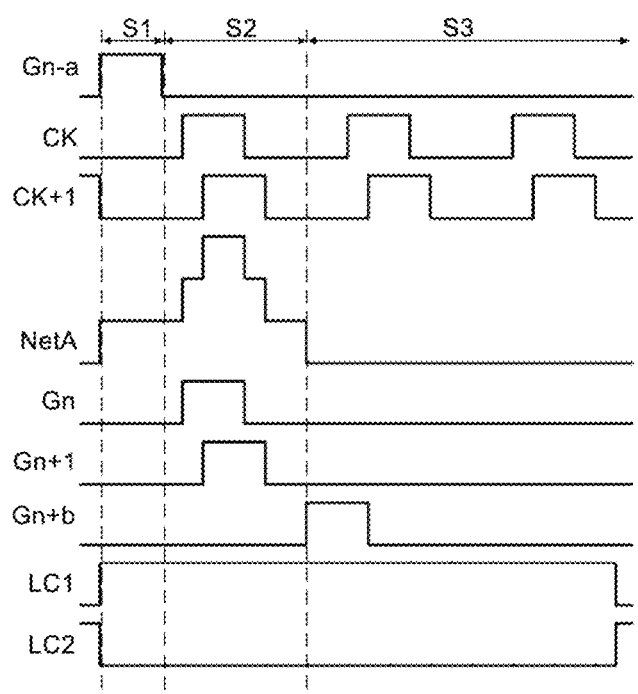
FIG. 18 is a timing diagram of the driving circuit shown in FIG. 17 according to at least one embodiment of the present disclosure.

As shown in FIG. 18, when at least one embodiment of the driving circuit shown in FIG. 17 of the present disclosure is in operation, the display period may include an input phase S1, an output phase S2 and a reset phase S3 which are set in sequence: when LC1 provides a high voltage signal, LC2 provides a low voltage signal, M5A is turned on, and M5B is turned off:

In the input phase S1, Gn–a outputs a high voltage signal, CK provides a low voltage signal, CK+1 provides a low voltage signal, M1 is turned on to pull up the potential of NA to a high voltage, and both M7A and M7B are turned on to pull down the potential of NB1 to a low voltage, and pull down the potential of NB2 to a low voltage: M10 and M16 are turned on, so that Gn and CK are connected, Gn+1 and CK+1 are connected, and both Gn and Gn+1 output a low voltage signal:

In the output phase S2, Gn–1 outputs a low voltage signal, and M1 is turned off:

At the beginning of the output phase S2, the potential of the first output clock signal provided by CK jumps from a low voltage to a high voltage, and C1 increases the potential of NA by bootstrapping:

After the output phase S2 starts for a period of time, the potential of the second output clock signal provided by CK+1 jumps from a low voltage to a high voltage, and C2 increases the potential of NA again by bootstrapping:

In the output phase S2, after a period of time, the potential of the first output clock signal provided by CK jumps from a high voltage to a low voltage, and C1 correspondingly pulls down the potential of NA:

In the output phase S2, after a period of time, the potential of the second output clock signal provided by CK+1 jumps from a high voltage to a low voltage, and C2 correspondingly pulls down the potential of NA:

In the output phase S2, both M10 and M16 are turned on, Gn and CK are connected, and Gn+1 is connected to CK+1:

In the output phase S2, when CK outputs a high voltage signal, Gn outputs a high voltage signal, and when CK+1 outputs a high voltage signal, Gn+1 outputs a high voltage signal:

In the input phase S1 and the output phase S2, under the control of the potential of NA, M6A and M6B are turned on to pull down the potential of NB1 and the potential of NB2:

At the beginning of the reset phase S3, when Gn+b provides a high voltage signal, M9 is turned on to pull down the potential of NA to a low voltage:

In the reset phase S3, Gn–1 provides a low voltage signal, the potential of NA is a low voltage, M7A and M7B are turned off, M6A and M6B are turned off, M5A is turned on, M5B is turned off, the potential of NB1 is a high voltage, and the potential of NB2 is a low voltage:

In the reset phase S3, M13B, M18B, and M8B are all turned off, and M13A, M13A, and M8A are all turned on, so as to control to connect Gn and the low-voltage terminal VSS, control to connect Gn+1 and the low-voltage terminal VSS, and control to connect NA and the low voltage terminal VSS, control the potential of NA to be a low voltage, and control both Gn and Gn+1 to output a low voltage signal.

When at least one embodiment of the driving circuit shown in FIG. 17 of the present disclosure is in operation, when LC1 provides a low voltage signal and LC2 provides a high voltage signal, in the reset phase S3, the potential of NB1 is a low voltage and the potential of NB2 is a high voltage.

When at least one embodiment of the driving circuit shown in FIG. 17 of the present disclosure is in operation, after one frame of display time ends, the CLR provides a high voltage signal, and M2, M17 and M12 are all turned on to control to connect NA and the low voltage terminal VSS, control to connect Gn and the low voltage terminal VSS, and control to connect Gn+1 and the low voltage terminal VSS, reset the potential of NA, the first gate driving signal outputted by Gn and the second gate driving signal outputted by Gn+1:

Before one frame of the display time starts, STV provides a high voltage signal, M2' is turned on, so that NA is connected to the low voltage terminal VSS, and the potential of NA is reset.

Figure 19:
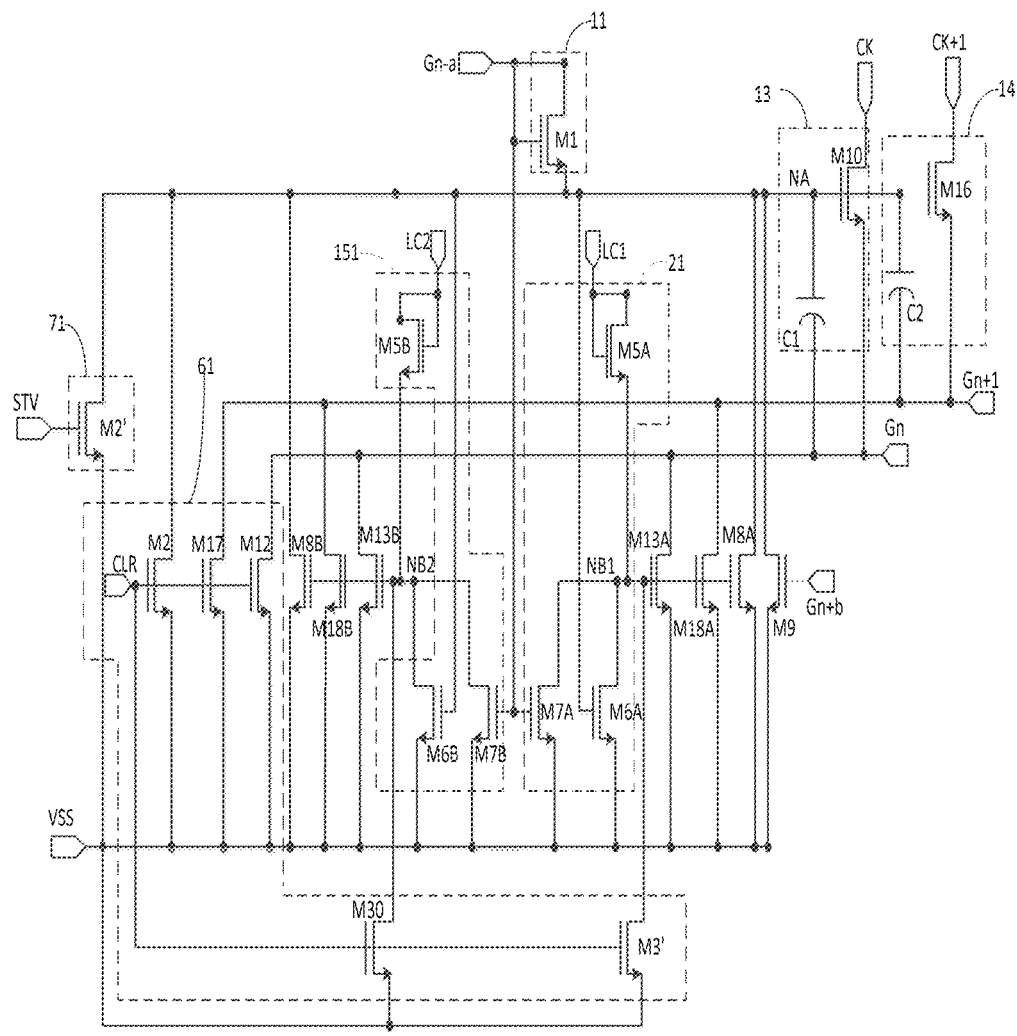
FIG. 19 is a circuit diagram of a driving circuit according to at least one embodiment of the present disclosure.

As shown in FIG. 19, on the basis of at least one embodiment of the driving circuit shown in FIG. 17, the post-frame reset module 61 may further include a fourth reset transistor M3' and a sixth reset transistor M30;

The gate electrode of the fourth reset transistor M3' is electrically connected to the post-frame reset control terminal CLR, the source electrode of the fourth reset transistor M3' is electrically connected to the first pull-down node NB1, and the drain electrode of the fourth reset transistor M3' is electrically connected to the low voltage terminal VSS:

The gate electrode of the sixth reset transistor M30 is electrically connected to the post-frame reset control terminal CLR, the source electrode of the sixth reset transistor M30 is electrically connected to the second pull-down node NB2, and the drain electrode of the sixth reset transistor M30 is electrically connected to the low voltage terminal VSS:

In at least one embodiment of the driving circuit shown in FIG. 19, all transistors are n-type thin film transistors, but not limited thereto.

In at least one embodiment of the driving circuit shown in FIG. 19, the first pull-down control terminal is the first control voltage terminal LC1, but not limited thereto.

When at least one embodiment of the driving circuit shown in FIG. 19 of the present disclosure is in operation, after one frame of display time ends, the CLR provides a high voltage signal, and both M3' and M30 are turned on to control to connect NB1 and the low voltage terminal VSS, control to connect NB2 and the low voltage terminal VSS, and reset the potential of NB1 and the potential of NB2.

In at least one embodiment of the present disclosure, the first pull-down module is further electrically connected to a second control voltage terminal, is configured to control to connect the first pull-down node and the first voltage terminal under the control of a second control voltage provided by the second control voltage terminal:

The second pull-down module is also electrically connected to the first control voltage terminal, and is configured to control to connect the second pull-down node and the first voltage terminal under the control of the first control voltage provided by the first control voltage terminal.

During specific implementation, the first pull-down module may also control to connect the first pull-down node and the first voltage terminal under the control of the second control voltage, so that when the potential of the second control voltage is a valid voltage, is configured to control to connect the first pull-down node and the first voltage terminal, and the second pull-down module can also control to connect the second pull-down node and the first voltage terminal under the control of the first control voltage, so that when the potential of the first control voltage is a valid voltage, control to connect the second pull-down node and the first voltage terminal.

In at least one embodiment of the present disclosure, when the transistor whose control electrode is connected to the first control voltage and the transistor whose control electrode is connected to the second control voltage are n-type transistors, the valid voltage is a high voltage; when the transistor whose control electrode is connected to the first control voltage and the transistor whose control electrode is connected to the second control voltage are p-type transistors, the valid voltage is a low voltage.

Optionally, the first pull-down module further includes an eighth pull-down transistor, and the second pull-down module further includes a ninth pull-down transistor;

A control electrode of the eighth pull-down transistor is electrically connected to the second control voltage terminal, a first electrode of the eighth pull-down transistor is electrically connected to the first pull-down node, and a second electrode of the eighth pull-down transistor is electrically connected to the first voltage terminal;

A control electrode of the ninth pull-down transistor is electrically connected to the first control voltage terminal, a first electrode of the ninth pull-down transistor is electrically connected to the second pull-down node, and a second electrode of the ninth pull-down transistor is electrically connected to the first voltage terminal.

Figure 20:
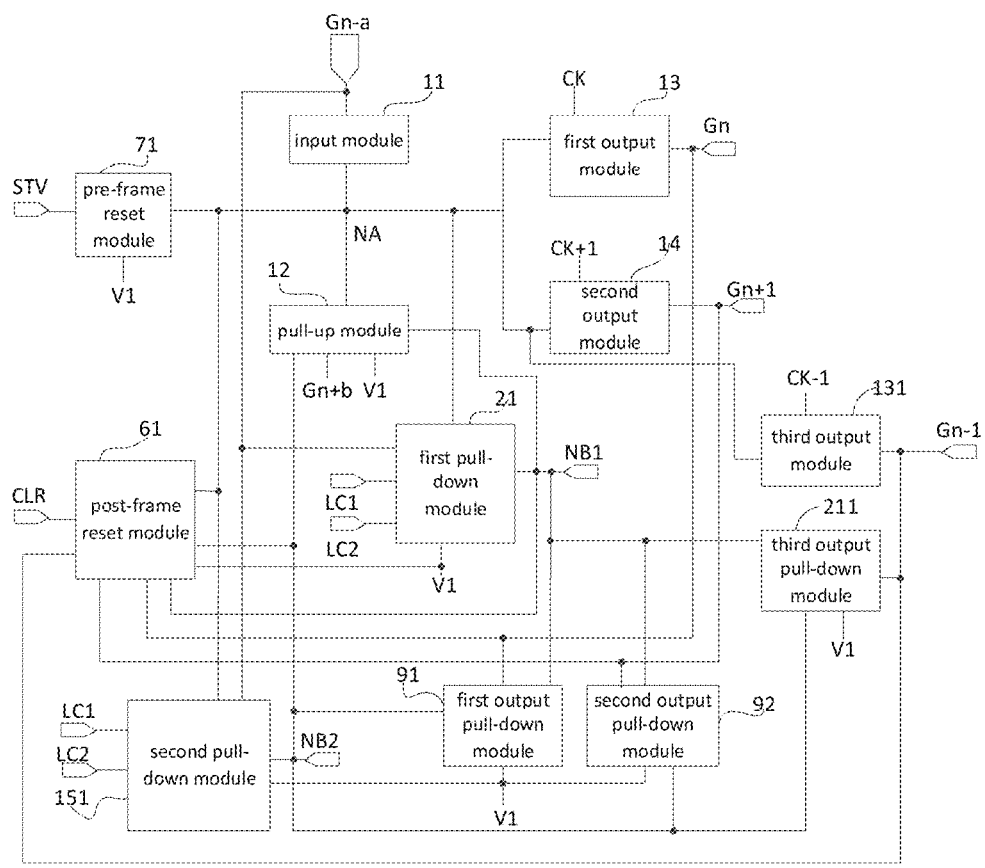
FIG. 20 is a structural diagram of a driving circuit according to at least one embodiment of the present disclosure.

As shown in FIG. 20, on the basis of at least one embodiment of the driving circuit shown in FIG. 16, The first pull-down module 21 is also electrically connected to the second control voltage terminal LC2, is configured to control to connect the first pull-down node NB1 and the first voltage terminal V1 under the control of the second control voltage provided by the second control voltage terminal LC2;

The second pull-down module 151 is also electrically connected to the first control voltage terminal LC1, is configured to control to connect the second pull-down node NB2 and the first voltage terminal V1 under the control of the first control voltage provided by the first control voltage terminal LC1;

The driving circuit described in at least one embodiment of the present disclosure may further include a third driving output terminal Gn−1, a third output module 131, and a third output pull-down module 211;

The third output module 131 is electrically connected to the pull-up node NA, the third driving output terminal Gn−1 and the third output clock signal terminal CK−1, is configured to control to connect the third driving output terminal Gn−1 and the third output clock signal terminal CK−1 under the control of the potential of the pull-up node NA, and control the third driving output terminal Gn−1 to output a third gate driving signal;

The third output pull-down module 211 is respectively electrically connected to the first pull-down node NB1, the second pull-down node NB2, the third driving output terminal Gn−1 and the first voltage terminal V1, and is configured to control to connect the third driving output terminal Gn−1 and the first voltage terminal V1 under the control of the potential of the first pull-down node NB1, and is configured to control to connect the third driving output terminal Gn−1 and the first voltage terminal V1 under the control of the potential of the second pull-down node NB2.

The post-frame reset module 61 is also electrically connected to the third driving output terminal Gn−1, is configured to control to connect the third driving output terminal Gn−1 and the first voltage terminal V1 under the control of the post-frame reset control signal provided by the post-frame reset control terminal CLR.

In at least one embodiment shown in FIG. 20, the first pull-down control terminal is the first control voltage terminal LC1, but not limited thereto.

During specific implementation, the driving circuit described in at least one embodiment of the present disclosure may include three driving output terminals and three output modules, the three output modules share the pull-up node NA, and the three driving output terminals are controlled to output corresponding gate driving signals respectively under the control of the potential of the pull-up node NA; the driving circuit described in at least one embodiment of the present disclosure further includes a third output pull-down module 211, and the third output pull-down module 211 can control to reset the potential of the third gate driving signal outputted by the third driving output terminal Gn−1 under the control of the potential of the pull-down node NB1 and the potential of the second pull-down node NB2; and, after one frame of display time ends, the post-frame reset module 61 may control to reset the potential of the third gate driving signal outputted by the third driving output terminal Gn−1 under the control of the post-frame reset control signal.

The difference between at least one embodiment of the driving circuit shown in FIG. 21 of the present disclosure and at least one embodiment of the driving circuit shown in FIG. 17 of the present disclosure is as follows: the driving circuit shown in FIG. 21 of the present disclosure also further may include a third driving output terminal Gn−1, a third output module 131 and a third output pull-down module:

The source electrode of the input transistor M1 is electrically connected to the high voltage terminal VGH: the source electrode of the first pull-down transistor M5A is electrically connected to the high-voltage terminal VGH, and the drain electrode of the fifth pull-down transistor M5B is electrically connected to the high voltage terminal VGH:

The first pull-down module 21 further includes an eighth pull-down transistor M3A, and the second pull-down module 151 further includes a ninth pull-down transistor M3B:

The gate electrode of the eighth pull-down transistor M3A is electrically connected to the second control voltage terminal LC2, the source electrode of the eighth pull-down transistor M3A is electrically connected to the first pull-down node NB1, and the drain electrode of the eighth pull-down transistor M3A is electrically connected to the low voltage terminal VSS:

The gate electrode of the ninth pull-down transistor M3B is electrically connected to the first control voltage terminal LC1, the source electrode of the ninth pull-down transistor M3B is electrically connected to the second pull-down node NB2, and the drain electrode of the ninth pull-down transistor M3B is electrically connected to the low voltage terminal VSS:

The third output module 131 includes a third output transistor M19 and a third capacitor C3, the third output reset module 132 includes a third output reset transistor M21, and the post-frame reset module 61 further includes a fifth reset transistor M20:

The gate electrode of the third output transistor M19 is electrically connected to the pull-up node NA, the source electrode of the third output transistor M19 is electrically connected to the third output clock signal terminal CK−1, and the drain electrode of the third output transistor M19 is electrically connected to the third driving output terminal Gn−1:

The first end of the third capacitor C3 is electrically connected to the pull-up node NA, and the second end of the third capacitor C3 is electrically connected to the third driving output terminal Gn−1:

The third output pull-down module includes a fifth output pull-down transistor M21A and a sixth output pull-down transistor M21B;

The gate electrode of the fifth output pull-down transistor M21A is electrically connected to the first pull-down node NB1, the source electrode of the fifth output pull-down transistor M21A is electrically connected to the third driving output terminal Gn−1, and the drain electrode of the fifth output pull-down transistor M21A is electrically connected to the low voltage terminal VSS:

The gate electrode of the sixth output pull-down transistor M21B is electrically connected to the second pull-down node NB2, the source electrode of the sixth output pull-down transistor M21B is electrically connected to the third driving output terminal Gn−1, and the drain electrode of the sixth output pull-down transistor M21B is electrically connected to the low voltage terminal VSS.

Figure 21:
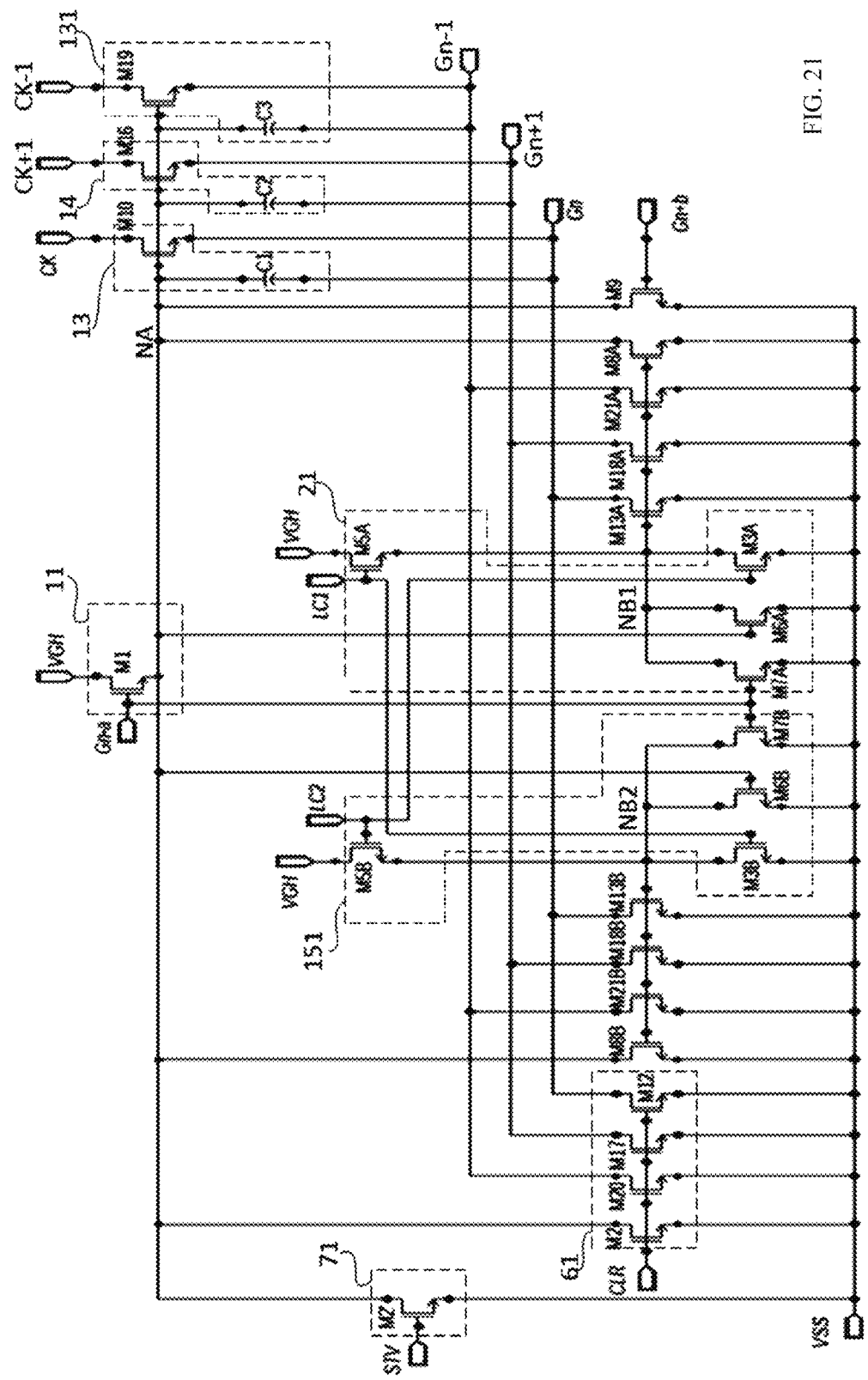
FIG. 21 is a circuit diagram of a driving circuit according to at least one embodiment of the present disclosure.

In at least one embodiment of the driving circuit shown in FIG. 21, all transistors are n-type thin film transistors, but not limited thereto.

In at least one embodiment of the driving circuit shown in FIG. 21, the first voltage terminal is the low voltage terminal VSS, but not limited thereto.

In at least one embodiment of the driving circuit shown in FIG. 21, the first pull-down control terminal is the first control voltage terminal LC1, but not limited thereto.

Figure 22:
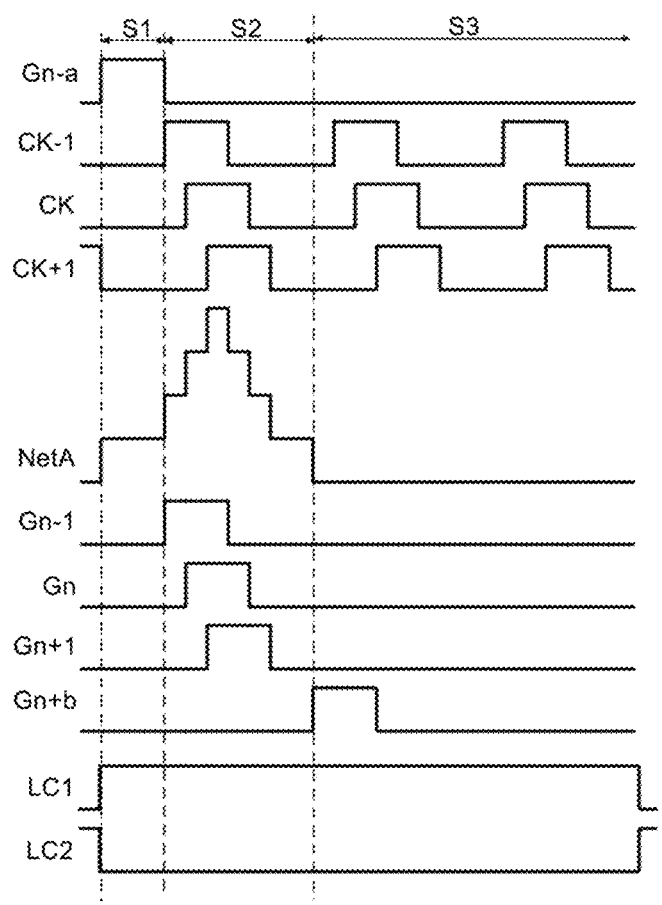
FIG. 22 is a timing diagram of the driving circuit shown in FIG. 21 according to at least one embodiment of the present disclosure.

As shown in FIG. 22, when at least one embodiment of the driving circuit shown in FIG. 21 of the present disclosure is in operation, the display period may include an input phase S1, an output phase S2 and a reset phase S3 which are set in sequence: when LC1 provides a high voltage signal and LC2 provides a low voltage signal, M5A is turned on, and M5B is turned off;

In the input phase S1, Gn-a outputs a high voltage signal, CK provides a low voltage signal, CK+1 provides a low voltage signal, CK−1 provides a low voltage signal, M1 is turned on, and the potential of NA is pulled up to a high voltage, M7A and M7B are turned on to pull down the potentials of NB1 and NB2 to a low voltage: M10, M16 and M19 are turned on to connect Gn and CK, connect Gn+1 and CK+1, connect Gn−1 and CK−1, Gn, Gn+1 and Gn−1 all output a low voltage signal:

In the output phase S2, Gn−1 outputs a low voltage signal, and M1 is turned off;

At the beginning of the output phase S2, the potential of the third output clock signal provided by CK−1 jumps from a low voltage to a high voltage, and C3 increases the potential of NA by bootstrapping:

After the output phase S2 starts for a period of time, the potential of the first output clock signal provided by CK jumps from a low voltage to a high voltage, and C1 increases the potential of NA again by bootstrapping;

In the output phase S2, after a period of time, the potential of the second output clock signal provided by CK+1 jumps from a low voltage to a high voltage, and C2 increases the potential of NA again by bootstrapping;

In the output phase S2, after a period of time, the potential of the third output clock signal provided by CK−1 jumps from a high voltage to a low voltage, and C3 correspondingly pulls down the potential of NA:

In the output phase S2, after a period of time, the potential of the first output clock signal provided by CK jumps from a high voltage to a low voltage, and C1 correspondingly pulls down the potential of NA:

In the output phase S2, after a period of time, the potential of the second output clock signal provided by CK+1 jumps from a high voltage to a low voltage, and C2 correspondingly pulls down the potential of NA:

In the output phase S2, M10, M16 and M19 are all turned on, Gn and CK are connected, Gn+1 is connected to CK+1, and Gn−1 is connected to CK−1;

In the output phase S2, when CK outputs a high voltage signal, Gn outputs a high voltage signal, when CK+1 outputs a high voltage signal, Gn+1 outputs a high voltage signal, and when CK−1 outputs a high voltage signal, Gn−1 outputs a high voltage signal:

In the input phase S1 and the output phase S2, under the control of the potential of NA, M6A and M6B are turned on to pull down the potential of NB1 and the potential of NB2:

At the beginning of the reset phase S3, Gn+b outputs a high voltage signal, and M9 is turned on to control to connect NA and the low voltage terminal VSS, so as to pull down the potential of NA to a low voltage:

In the reset phase S3, Gn-a provides a low voltage signal, the potential of NA is a low voltage, both M6A and M7A are turned off, M5A is turned on, and the potential of NB1 is a high voltage;

In the reset phase S3, LC2 provides a low voltage signal, M5B is turned off, both M6B and M7B are turned off, and the potential of NB2 is maintained at a low voltage;

In the reset phase S3, M13A, M18A, M21A and M8A are all turned on to control to connect Gn and the low-voltage terminal VSS, control to connect Gn+1 and the low-voltage terminal VSS, and control to connect Gn−1 and the low-voltage terminal VSS, control to connect NA and the low voltage terminal VSS, so that Gn, Gn+1 and Gn−1 all output a low voltage signal, and the potential of NA is a low voltage.

When at least one embodiment of the driving circuit shown in FIG. 21 of the present disclosure is in operation, after one frame of display time ends, the CLR provides a high voltage signal, and M2, M20, M17 and M12 are all turned on to control to connect NA and low voltage terminal VSS, control to connect Gn and low-voltage terminal VSS, control to connect Gn+1 and the low-voltage terminal VSS, control to connect Gn−1 and the low-voltage terminal VSS, control to reset the potential of NA, the first gate driving signal outputted by Gn, the second gate driving signal outputted by Gn+1 and the third gate driving signal outputted by Gn−1:

Before one frame of display time starts, STV provides a high voltage signal, M2' is turned on, so that NA and the low voltage terminal VSS are connected, and the potential of NA is reset.

In at least one embodiment of the present disclosure, the driving circuit may further include at least two output modules:

The output module is electrically connected to the pull-up node and the corresponding driving output terminal respectively, and is configured to control to output the corresponding gate driving signal through the corresponding driving output terminal under the control of the potential of the pull-up node.

During specific implementation, the driving circuit described in at least one embodiment of the present disclosure may include a plurality of output modules, the plurality of output modules share the same pull-up node, and under the control of the pull-up node, the corresponding driving output terminal is controlled to output a corresponding gate driving signal, so that the output of a plurality of stages of gate driving signals is realized and the number of transistors can be reduced, which is beneficial to realize a narrow frame.

The display device according to the embodiment of the present disclosure includes the above-mentioned driving circuit.

The display device provided by the embodiment of the present disclosure may be any product or component with a display function, such as a mobile phone, a tablet computer, a television, a monitor, a notebook computer, a digital photo frame, and a navigator.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A driving circuit, comprising a pull-up node, an input module, a pull-up module, a first output module and a second output module;
    the input module is electrically connected to an input terminal and a pull-up node, and is configured to control a potential of the pull-up node under the control of an input signal provided by the input terminal;
    the pull-up module is electrically connected to the pull-up node, is configured to control the potential of the pull-up node;
    the first output module is electrically connected to a first driving output terminal and the pull-up node respectively, and is configured to output a first gate driving signal through the first driving output terminal under the control of the potential of the pull-up node;
    the second output module is electrically connected to a second driving output terminal and the pull-up node, respectively, and is configured to output a second gate driving signal through the second driving output terminal under the control of the potential of the pull-up node;
    wherein the driving circuit further comprises a first pull-down node and a first pull-down module; wherein
    the first pull-down module is respectively electrically connected to the first pull-down node, the pull-up node, the input terminal, a first pull-down control terminal and a first voltage terminal, is configured to control to connect the first pull-down node and the first voltage terminal under the control of the potential of the pull-up node, and control a potential of the first pull-down node under the control of a first pull-down control signal provided by the first pull-down control terminal, control to connect the first pull-down node and the first voltage terminal under the control of an input signal provided by the input terminal.

2. The driving circuit according to claim 1, wherein the first pull-down control terminal is a first pull-down control clock signal terminal;
    the first pull-down module is further electrically connected to a second pull-down control clock signal terminal, and is configured to control to connect the first pull-down node and the first voltage terminal under the control of a second pull-down control clock signal provided by the second pull-down control clock signal terminal.

3. The driving circuit according to claim 1, further comprising a first output pull-down module and a second output pull-down module; wherein
    the first output pull-down module is respectively electrically connected to the first pull-down node, the first driving output terminal and the first voltage terminal, and is configured to control to connect the first driving output terminal and the first voltage terminal under the control of the potential of the first pull-down node;
    the second output pull-down module is respectively electrically connected to the first pull-down node, the second driving output terminal and the first voltage terminal, and is configured to control to connect the second driving output terminal and the first voltage terminal under the control of the potential of the first pull-down node.

4. The driving circuit according to claim 3, wherein the first output pull-down module includes a first output pull-down transistor, and the second output pull-down module includes a second output pull-down transistor;
    a control electrode of the first output pull-down transistor is electrically connected to the first pull-down node, a first electrode of the first output pull-down transistor is electrically connected to the first driving output terminal, and a second electrode of the first output pull-down transistor is electrically connected to the first voltage terminal;
    a control electrode of the second output pull-down transistor is electrically connected to the first pull-down node, a first electrode of the second output pull-down transistor is electrically connected to the second driving output terminal, and a second electrode of the second output pull-down transistor is electrically connected to the first voltage terminal.

5. The driving circuit according to claim 1, further comprising a first pull-down node; wherein the pull-up module is further electrically connected to the first pull-down node, a pull-up reset terminal and a first voltage terminal, respectively, is configured to control to connect the pull-up node and the first voltage terminal under the control of the potential of the first pull-down node, and control to connect the pull-up node and the first voltage terminal under the control of a pull-up reset signal provided by the pull-up reset terminal.

6. The driving circuit according to claim 5, wherein the pull-up module comprises a first pull-up transistor and a second pull-up transistor;
    a control electrode of the first pull-up transistor is electrically connected to the first pull-down node, a first electrode of the first pull-up transistor is electrically connected to the pull-up node, and a second electrode of the first pull-up transistor is electrically connected to the first voltage terminal;
    a control electrode of the second pull-up transistor is electrically connected to the pull-up reset terminal, a first electrode of the second pull-up transistor is electrically connected to the pull-up node, and a second electrode of the second pull-up transistor is electrically connected to the first voltage terminal;
    the input module includes an input transistor;
    a control electrode of the input transistor is electrically connected to the input terminal, a first electrode of the input transistor is electrically connected to the input terminal or a second voltage terminal, and a second electrode of the input transistor is electrically connected to the pull-up node.

7. The driving circuit according to claim 1, wherein the first output module is also electrically connected to a first output clock signal terminal, is configured to control to connect the first driving output terminal and the first output clock signal terminal under the control of the potential of the pull-up node;

the second output module is also electrically connected to a second output clock signal terminal, is configured to control to connect the second driving output terminal and the second output clock signal terminal under the control of the potential of the pull-up node.

8. The driving circuit according to claim 1, further comprising a first output reset module and a second output reset module; wherein the first output reset module is respectively electrically connected to a first reset control clock signal terminal, the first driving output terminal and the first voltage terminal, and is configured to control to connect the first driving output terminal and the first voltage terminal under the control of a first reset control clock signal provided by the first reset control clock signal terminal;

the second output reset module is respectively electrically connected to a second reset control clock signal terminal, the second driving output terminal and the first voltage terminal, and is configured to control to connect the second driving output terminal and the first voltage terminal under the control of a second reset control clock signal provided by the second reset control clock signal terminal.

9. The driving circuit according to claim 8, wherein the first output reset module comprises a first output reset transistor, and the second output reset module comprises a second output reset transistor;

a control electrode of the first output reset transistor is electrically connected to a first reset control clock signal terminal, a first electrode of the first output reset transistor is electrically connected to the first driving output terminal, and a second electrode of the first output reset transistor is electrically connected to the first voltage terminal;

a control electrode of the second output reset transistor is electrically connected to the second reset control clock signal terminal, a first electrode of the second output reset transistor is electrically connected to the second driving output terminal, and a second electrode of the second output reset transistor is electrically connected to the first voltage terminal.

10. The driving circuit according to claim 1, further comprising a first pull-down node and a post-frame reset module; wherein the post-frame reset module is respectively electrically connected to a post-frame reset control terminal, the pull-up node, the first driving output terminal, the second driving output terminal, the first pull-down node and the first voltage terminal, is configured to control, under the control of a post-frame reset control signal provided by the post-frame reset control terminal, to connect the pull-up node and the first voltage terminal, to connect the first driving output terminal and the first voltage terminal, to connect the second driving output terminal and the first voltage terminal, and to connect the first pull-down node and the first voltage terminal.

11. The driving circuit according to claim 10, wherein the post-frame reset module comprises a first reset transistor, a second reset transistor, a third reset transistor, and a fourth reset transistor;

a control electrode of the first reset transistor is electrically connected to the post-frame reset control terminal, a first electrode of the first reset transistor is electrically connected to the pull-up node, and a second electrode of the first reset transistor is electrically connected to the first voltage terminal;

a control electrode of the second reset transistor is electrically connected to the post-frame reset control terminal, a first electrode of the second reset transistor is electrically connected to the first driving output terminal, and a second electrode of the second reset transistor is electrically connected to the first voltage terminal;

a control electrode of the third reset transistor is electrically connected to the post-frame reset control terminal, a first electrode of the third reset transistor is electrically connected to the second driving output terminal, and a second electrode of the third reset transistor is electrically connected to the first voltage terminal;

a control electrode of the fourth reset transistor is electrically connected to the post-frame reset control terminal, a first electrode of the fourth reset transistor is electrically connected to the first pull-down node, and a second electrode of the fourth reset transistor is electrically connected to the first voltage terminal.

12. The driving circuit according to claim 1, further comprising a pre-frame reset module;

the pre-frame reset module is respectively electrically connected to a pre-frame reset control terminal, the pull-up node and the first voltage terminal, and is configured to connect the pull-up node and the first voltage terminal under the control of a pre-frame reset control signal provided by the pre-frame reset control terminal.

13. The driving circuit according to claim 1, wherein the first output module comprises a first output transistor and a first capacitor, and the second output module comprises a second output transistor and a second capacitor;

a control electrode of the first output transistor is electrically connected to the pull-up node, a first electrode of the first output transistor is electrically connected to a first output clock signal terminal, and a second electrode of the first output transistor is electrically connected to the first driving output terminal;

a first end of the first capacitor is electrically connected to the pull-up node, and a second end of the first capacitor is electrically connected to the first driving output terminal;

a control electrode of the second output transistor is electrically connected to the pull-up node, a first electrode of the second output transistor is electrically connected to a second output clock signal terminal, and a second electrode of the second output transistor is electrically connected to the second driving output terminal;

a first end of the second capacitor is electrically connected to the pull-up node, and a second end of the second capacitor is electrically connected to the second driving output terminal.

14. The driving circuit according to claim 1, wherein the first pull-down module comprises a first pull-down transistor, a second pull-down transistor and a third pull-down transistor;

a control electrode of the first pull-down transistor is electrically connected to the first pull-down control terminal, a first electrode of the first pull-down transistor is electrically connected to the first pull-down control terminal or a second voltage terminal, a second electrode of the first pull-down transistor is electrically connected to the first pull-down node;

a control electrode of the second pull-down transistor is electrically connected to the pull-up node, a first electrode of the second pull-down transistor is electrically connected to the first pull-down node, and a second electrode of the second pull-down transistor is electrically connected to the first voltage terminal;

a control electrode of the third pull-down transistor is electrically connected to the input terminal, a first electrode of the third pull-down transistor is electrically connected to the first pull-down node, and a second electrode of the third pull-down transistor is electrically connected to the first voltage terminal.

15. The driving circuit according to claim 14, wherein the first pull-down control terminal is a first pull-down control clock signal terminal; the first pull-down module further comprises a fourth pull-down transistor;

a control electrode of the fourth pull-down transistor is electrically connected to the second pull-down control clock signal terminal, a first electrode of the fourth pull-down transistor is electrically connected to the first pull-down node, and a second electrode of the fourth pull-down transistor is electrically connected to the first voltage terminal.

16. The driving circuit according to claim 1, further comprising a third output module; wherein the third output module is electrically connected to the pull-up node, a third driving output terminal and a third output clock signal terminal, and is configured to control to connect the third driving output terminal and the third output clock signal terminal under the control of the potential of the pull-up node, wherein the driving circuit further includes a third output reset module; wherein the third output reset module is respectively electrically connected to a third reset control clock signal terminal, the third driving output terminal and the first voltage terminal, and is configured to control to connect the third driving output terminal and the first voltage terminal under the control of a third reset control clock signal provided by the third reset control clock signal terminal, wherein the third output reset module comprises a third output reset transistor; a control electrode of the third output reset transistor is electrically connected to the third reset control clock signal terminal, a first electrode of the third output pull-down transistor is electrically connected to the third driving output terminal, and a second electrode of the third output pull-down transistor is electrically connected to the first voltage terminal;

or the driving circuit further includes a post-frame reset module; wherein the post-frame reset module is respectively electrically connected to the post-frame reset control terminal, the third driving output terminal and the first voltage terminal, and is configured to control to connect the third driving output terminal and the first voltage terminal under the control of the post-frame reset control signal provided by the post-frame reset control terminal, wherein the post-frame reset module further comprises a fifth reset transistor; a control electrode of the fifth reset transistor is electrically connected to the post-frame reset control terminal, a first electrode of the fifth reset transistor is electrically connected to the third driving output terminal, and a second electrode of the fifth reset transistor is electrically connected to the first voltage terminal;

or wherein the third output module comprises a third output transistor; a control electrode of the third output transistor is electrically connected to the pull-up node, a first electrode of the third output transistor is electrically connected to the third output clock signal terminal, and a second electrode of the third output transistor is electrically connected to the third driving output terminal.

17. The driving circuit according to claim 1, further comprising a second pull-down node and a second pull-down module; wherein the first pull-down control terminal is a first control voltage terminal; the first control voltage terminal is configured to provide a first control voltage;

the second pull-down module is respectively electrically connected to the second pull-down node, the pull-up node, the input terminal, a second control voltage terminal and the first voltage terminal, and is configured to control to connect the second pull-down node and the first voltage terminal under the control of the potential of the pull-up node, control a potential of the second pull-down node under the control of a second control voltage provided by the second control voltage terminal, and control to connect the second pull-down node and the first voltage terminal under the control of an input signal provided by the input terminal.

18. The driving circuit according to claim 17, wherein the first pull-down module is further electrically connected to a second control voltage terminal, is configured to control to connect the first pull-down node and the first voltage terminal under the control of a second control voltage provided by the second control voltage terminal;

the second pull-down module is also electrically connected to the first control voltage terminal, and is configured to control to connect the second pull-down node and the first voltage terminal under the control of a first control voltage provided by the first control voltage terminal.

19. A display device comprising a driving circuit according to claim 1.

* * * * *